United States Patent [19]

Brebels et al.

[11] Patent Number: 5,675,295
[45] Date of Patent: Oct. 7, 1997

[54] MICROWAVE OSCILLATOR, AN ANTENNA THEREFOR AND METHODS OF MANUFACTURE

[75] Inventors: Steven Brebels, Hechtel-Eksel, Belgium; Kristel Fobelets, London, United Kingdom; Philip Pieters; Eric Beyne, both of Heverlee, Belgium; Gustaaf Borghs, Kessel-Lo, Belgium

[73] Assignee: IMEC vzw, Belgium

[21] Appl. No.: 646,515

[22] Filed: May 8, 1996

[51] Int. Cl.$^6$ ........................................ H03B 5/18
[52] U.S. Cl. ............... 331/105; 331/96; 331/107 DP; 331/107 T; 331/107 SL; 331/108 C; 331/185; 455/129
[58] Field of Search ............... 331/74, 77, 96, 331/99, 100, 105, 107 DP, 107 T, 107 SL, 108 C, 117 D, 185; 455/129

[56] References Cited

U.S. PATENT DOCUMENTS

| | | | |
|---|---|---|---|
| 3,568,110 | 3/1971 | Ivanek | 333/83 |
| 4,539,528 | 9/1985 | Bayraktaroglu et al. | 330/287 |
| 4,745,374 | 5/1988 | Nishizawa et al. | 331/96 |
| 4,789,645 | 12/1988 | Calviello et al. | 437/51 |
| 5,248,947 | 9/1993 | Shiga | 331/99 X |
| 5,315,753 | 5/1994 | Jensen et al. | 29/600 |

FOREIGN PATENT DOCUMENTS

| | | |
|---|---|---|
| 0 296 838 A2 | 12/1988 | European Pat. Off. |
| 0 296 838 A3 | 12/1988 | European Pat. Off. |

OTHER PUBLICATIONS

E.R. Brown et al, "Fundamental Oscillations up to 200 GHz in Resonant Tunneling Diodes and New Estimates of Their Maxium Oscillation Frequency From Stationary-State Tunneling Theory" Aug. 1, (1988) *J. Appl. Phys.* 64(3):1519–1529.

V.P. Kesan, et al., "Microwave and Millimeter-Wave Qwitt Diode Oscillators" Dec. 12, (1989) *IEEE Transactions On Microwave Theory And Techniques* 37(12):1933–1939.

P. Mounaix, et al., "Integration of a Resonant-Tunneling Structure For Microwave Applications" Apr. 1, (1991) *Journal De Physique III* 1(4):539–549.

*Primary Examiner*—David Mis
*Attorney, Agent, or Firm*—Knobbe, Martens, Olson & Bear, LLP

[57] ABSTRACT

A millimeter or microwave oscillator device for a receiver or a transmitter is described. The oscillator device including a high frequency oscillating circuit including an active device 41; said active device 41 having a first and a second contact 56, 52, a signal line 49 of said oscillator device 41 being connected to said first contact 56 for connection to a load circuit 43; a biasing circuit 47 for said active device; and a low frequency oscillation suppression circuit; wherein said low frequency oscillation suppression circuit includes a decoupling capacitor 45 and one electrode of said decoupling capacitor 45 is connected to said second contact 52. A manufacturing method for the oscillator device is also disclosed.

14 Claims, 22 Drawing Sheets

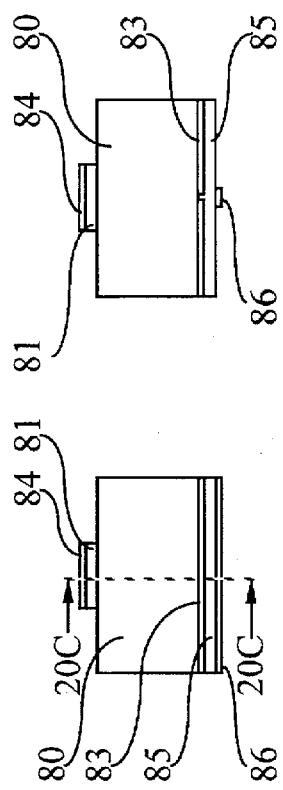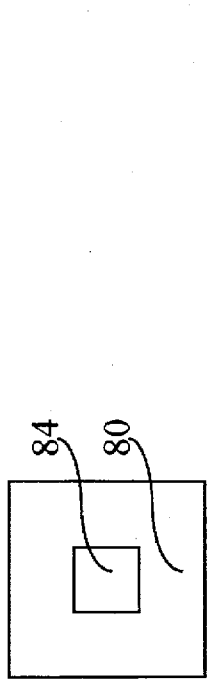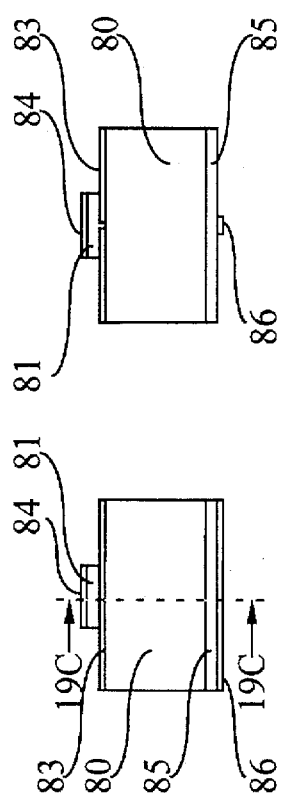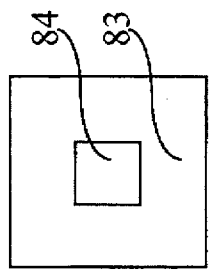

MICROWAVE OSCILLATOR, AN ANTENNA THEREFOR AND METHODS OF MANUFACTURE

This application claims the benefit of U.S. Provisional Application No. 60/001,643, filed Jul. 28, 1995.

The present invention relates to microwave or millimeter wave oscillator devices which may be used in receivers, transmitters, transceivers or in other electronic components, as well as relating to antennae for use with these devices and manufacturing methods therefor.

Electronic systems including an oscillator powered by a power circuit and connected to a load may suffer from noise. There are at least four major sources of noise in such an electronic system: external electromagnetic interference (EMI), reflection noise, crosstalk noise, and unwanted resonant oscillations. Any change in characteristic impedance along the length of a line results in some reflection of any AC signal. Typical controlled impedance wiring systems in high density digital electronic circuits include: microstrip lines—a signal line on top of a dielectric layer over a conducting reference plane, coplanar lines—a signal line spaced from two coplanar reference lines on either side of the signal line, striplines—a signal line sandwiched between, and insulated from two reference planes, and offset striplines—two signal lines offset symmetrically about a midline and sandwiched between two reference planes. Striplines and offset striplines offer the best protection against electromagnetic interference as the signal line(s) is (are) bordered by two large reference planes (power or ground) acting as a Faraday cage. The reference planes isolate the signal line from adjacent metal lines and reduce cross-talk. Strip lines increase the cost and complexity of the design. On the other hand, microstrip lines and coplanar lines are simpler to design and may require less metal and insulating layers. They are, however, subject to some electromagnetic interference as the signal line may be exposed. Such lines are also more prone to crosstalk and switching noise.

Unwanted oscillations depend on the circuit design and may also be affected by parasitic capacitances and inductances forming resonant circuits having a center frequency different from the center frequency of the oscillator itself.

A monolithic microwave and millimeter wave transmitter or receiver is known from EP-A-296 838, which includes a microstrip patch antenna which acts as the resonator for an oscillator powered by IMPATT diodes. The device may be mounted on the end of a waveguide. No method is proposed of how to prevent electromagnetic interference caused by the electromagnetic radiation from the patch antenna influencing the active devices and the microstrip lines. Unwanted oscillations may also be generated in the circuit. The frequency of the oscillator is tunable by adjusting the load coupled to the patch antenna. A second IMPATT diode circuit and second patch which is strongly coupled to the resonator patch are provided in parallel to the first diode circuit and patch. The bias voltage on the second diode circuit is adjusted to change the load coupled to the first diode circuit and hence the frequency. The frequency adjustment circuit requires two extra diodes and a further patch. Although the matching of the antenna to the active device is mentioned, no method of optimizing the antenna load is described.

U.S. Pat. No. 5,315,753 describes a method of forming a high dielectric antenna structure in which one or more high dielectric film layers are applied to a dielectric base layer yielding a dielectric structure having a dielectric constant greater than that of the dielectric base layer. A patch is applied to the high dielectric constant layer and a hole is made through all the layers for connection to a coaxial cable. Similar constructions are described in U.S. Pat. No. 4,401,988 and U.S. Pat. No. 4,070,676. As pointed out in GB-A-2 046 530, these known antennae have the signal conductor directly connected to the patch and are not relevant to applications on high dielectric constant microstrip boards. GB-A-2 046 530 proposes a patch antenna on a low dielectric material coupled to a feed line sandwiched between the low dielectric constant material and the microstrip board and a reference plane on the other side of the board. In the article by Menzel and Grabherr, entitled "A microstrip patch antenna with coplanar feed line", IEEE Microwave and Guided Wave Letters, vol. 1, No. 11, November 1991, a microstrip antenna fed by capacitively and inductively fed slots is described.

It is known to grow epitaxial layers on a semiconductor substrate and then transfer these to another substrate. Mechanically separating (cleaving) epitaxial layers is known, e.g. from the article by J. C. C. Fan, Journal of Physics (Paris) Vol. 43, C1-327, 1982, or U.S. Pat. No. 4,727,047. Epitaxial lift-off (ELO) by selectively etching a sacrificial layer is described in the article by Eli Yablonvitch, et alia, entitled "Extreme selectivity in the lift-off of epitaxial GaAs films", Applied Physics Letters, Vol. 51 (26), 28 Dec. 1987, American Institute of Physics, as well as more fully in U.S. Pat. No. 4,846,931 and U.S. Pat. No. 4,883,561. Both mechanical and chemical lift-off are described in U.S. Pat. No. 5,258,320 for the transfer of essentially single crystal silicon films in the manufacture of a display panel.

Conventionally, Multichip Modules (MCM) technology is limited to very large size integrated digital circuits. It is described in detail in the book "Multichip Module Technologies and Alternatives: the basics", Van Nostrand Reinhold, 1993. An application to anything other than VLSI's is not described. MCM is a packaging method which acts as a "geometry transformer" between the small line pitch of VLSI's and the coarser line pitch required to make external connections. In particular, thin film MCM is described (MCM-D) in which alternate layers of thin insulation and metal are deposited on a substrate. The metal layers are patterned to form a system of perpendicularly arranged wiring layers. The signal lines in one layer all run in one direction which is perpendicular to the direction of the layers underneath or above. This reduces the capacitive coupling between the layers and hence the cross-talk. Reference layers (ground or power) may be provided between multiple signal line layers. Fixing of the VLSI chip to the MCM substrate is known as die bonding and includes solder bump and flip chip technologies. Several methods are described for making the electrical connections from the VLSI chip to the wiring layers such as wire bonding, TAB and flip chip. By means of etching vias through the insulation layers, the wiring layers may be connected to each other to interconnect several chips as well as to interconnect other system components to the VLSI's. Increasing the packaging density reduces the size. This may be achieved by reducing the line pitch or increasing the number of interconnection layers. Line pitch is dependent upon the accuracy of the manufacturing methods used, line-to-line impedance limitations and via density and spacing requirements. Increasing the number of interconnection layers has the disadvantageous effects of increasing the costs and complexity of manufacture.

An object of the invention is to provide an improved microwave or millimeter wave oscillator device and a manufacturing method therefor. In particular, it is an object of the present invention to provide an oscillator device with which unwanted low frequency oscillations may be suppressed.

For optimum power output of an oscillator it is necessary to match the impedance of the active device of the oscillator to the impedance of the load. Bearing in mind the limitations of the known microwave oscillators, it is a further object of the invention to have a design which provides an increased number of independently adjustable parameters to optimize the impedance match.

A further object of the invention is to provide a small patch antenna for microwave and millimeter wave frequencies with good radiation efficiency as well as a manufacturing method therefor.

It is still a further object of the present invention to provide a design and a design method for a monolithic or pseudo-monolithic high frequency transceiver including an oscillator, which will be low in production cost, low in power consumption, which will have small dimensions, which will be robust and which will be straightforward to introduce in a production line as used in existing microelectronics industries.

SUMMARY OF THE INVENTION

The present invention may provide a millimeter or microwave oscillator device for a receiver or a transmitter comprising: a high frequency oscillating circuit including an active device, said active device having a first and a second contact, a signal line of said oscillator device being connected to said first contact for connection to a load circuit, a biasing circuit for said active device, and a low frequency oscillation suppression circuit, wherein said low frequency oscillation suppression circuit includes a decoupling capacitor and one electrode of said decoupling capacitor is connected to said second contact.

In accordance with the present application, low frequency means a frequency lying below the millimeter wave and microwave frequency bands, i.e. less than 500 MHz.

The present invention also includes a method of fabrication of a microwave or millimeter wave oscillator device for a transmitter or receiver, comprising the steps of: depositing a first conductive layer onto a first substrate, forming a vertical active device as a mesa on said first substrate, and forming a back contact region and a capacitor electrode region in said first conductive layer.

The step of forming the vertical active device may include a transfer step including the steps: depositing a sacrificial layer onto a second semiconductor substrate, depositing active layers onto said sacrificial layer, etching said layered second semiconductor substrate to form said vertical active device as a mesa, separating said vertical active device from said second semiconductor substrate by selectively etching said sacrificial layer, and bonding said vertical active device to said first substrate.

The present invention also includes a method for designing a microwave or millimeter wave oscillator device, comprising the steps of: measuring the direct current - voltage characteristic of an active device with a negative differential resistance region, determining the operating frequency for the oscillator circuit, determining the characteristic impedance and the optimum oscillation conductance, and optimizing the load of the oscillator circuit to obtain the optimum power output. The second antenna element of claim 2 provides a suitable means for optimization of the load circuit.

The characteristic impedance and the optimum oscillation conductance may be determined by means of a numerical - graphical method.

The dependent claims define further embodiments of the present invention.

The present invention may provide the advantage of a low cost high frequency oscillator device and manufacturing method therefor.

The present invention may provide the advantage of reducing the amount of high value scrap during the manufacture of high frequency oscillator devices.

The present invention may provide the advantage of a high frequency oscillator device with at least one of higher efficiency, higher power output and greater bandwidth.

The present invention may provide the advantage of a high frequency oscillator device in which parasitic passive components have less effect on the final performance.

The present invention may provide the advantage of a high frequency oscillator device with a larger freedom to adjust electrical parameters thereof. In particular not only can the antenna be matched to the oscillating device but the antenna impedance can be optimized with respect to the active device without substantially changing the operating frequency.

The present invention may provide the advantage of a high frequency oscillator device with less unwanted electromagnetic disturbances and oscillations.

The present invention may provide the advantage of a high frequency oscillator device which is easier to design and construct for a particular application.

The present invention may provide the advantage of a manufacturing method for a high frequency oscillator device which only requires five masks.

The present invention may also provide an improved pseudo-monolithic manufacturing method.

Further advantages of the transceiver according to the present invention may be compactness and robustness of the design. The production of the transceiver is straightforward and requires only five masks yielding a low cost. Moreover the transceiver gives a good performance in the lower millimeter wave range by omitting the losses and parasitics of the interconnection and matching circuits. Realization of frequency modulation can be done by changing the bias voltage. The antenna design can be easily adapted to work also in the higher millimeter wave range. A higher output power can be easily realized by connecting different transceivers together by transmission lines of one wavelength between the active devices and eliminating all unwanted modes by putting a small resistor halfway along the transmission lines.

Other features and advantages of the present invention will become apparent from the following description of the invention which refers to the accompanying drawings.

BRIEF DESCRIPTION OF THE DRAWINGS

FIGS. 17a to 20c show various arrangements of the antennae in accordance with the third embodiment of the present invention.

DESCRIPTION OF THE ILLUSTRATIVE EMBODIMENTS

In the following the invention will be described with reference to a resonant tunnel diode (RTD) as an active device in an oscillator. The invention is not limited thereto. The active device may also be a double barrier or single barrier Quantum Well Injection Transit Time diode (QWITT), an IMPATT diode, a TUNNET or BARITT diode, a High Electron Mobility Transistor (HEMT) etc. In accordance with the present invention the active device may be used as a mixer in a transmitter or receiver. Additionally, the oscillator device in accordance with the present invention may be used in detectors, multipliers and the like, in particular radar transceivers and detectors.

The drawings are schematic representations for illustration purposes. Some of the dimensions have been exaggerated for clarity purposes.

The active device in accordance with the present invention may have a non-linear DC current - voltage behavior, e.g. of an RTD. Further, the diode may have a large depletion region on one side (a so called QWITT). For negative voltages the depletion layer is in accumulation and the typical behavior of an RTD is observed. For positive voltages, however, the QWITT behaves as a transit time device: the depletion layer shifts the characteristic to higher voltages. Hence, higher oscillating output power can be realized. The QWITT's show a clear negative conductance in a rather broad bias range. The current density of the different QWITT's is almost independent of active area size or shape. In accordance with the present invention an improved layer structure for the RTD may be used (e.g. InGaAs) to obtain a large difference in current and voltage between the top and the valley ($\Delta I$ and $\Delta V$) of the negative differential resistance (NDR) zone.

Figure 1:
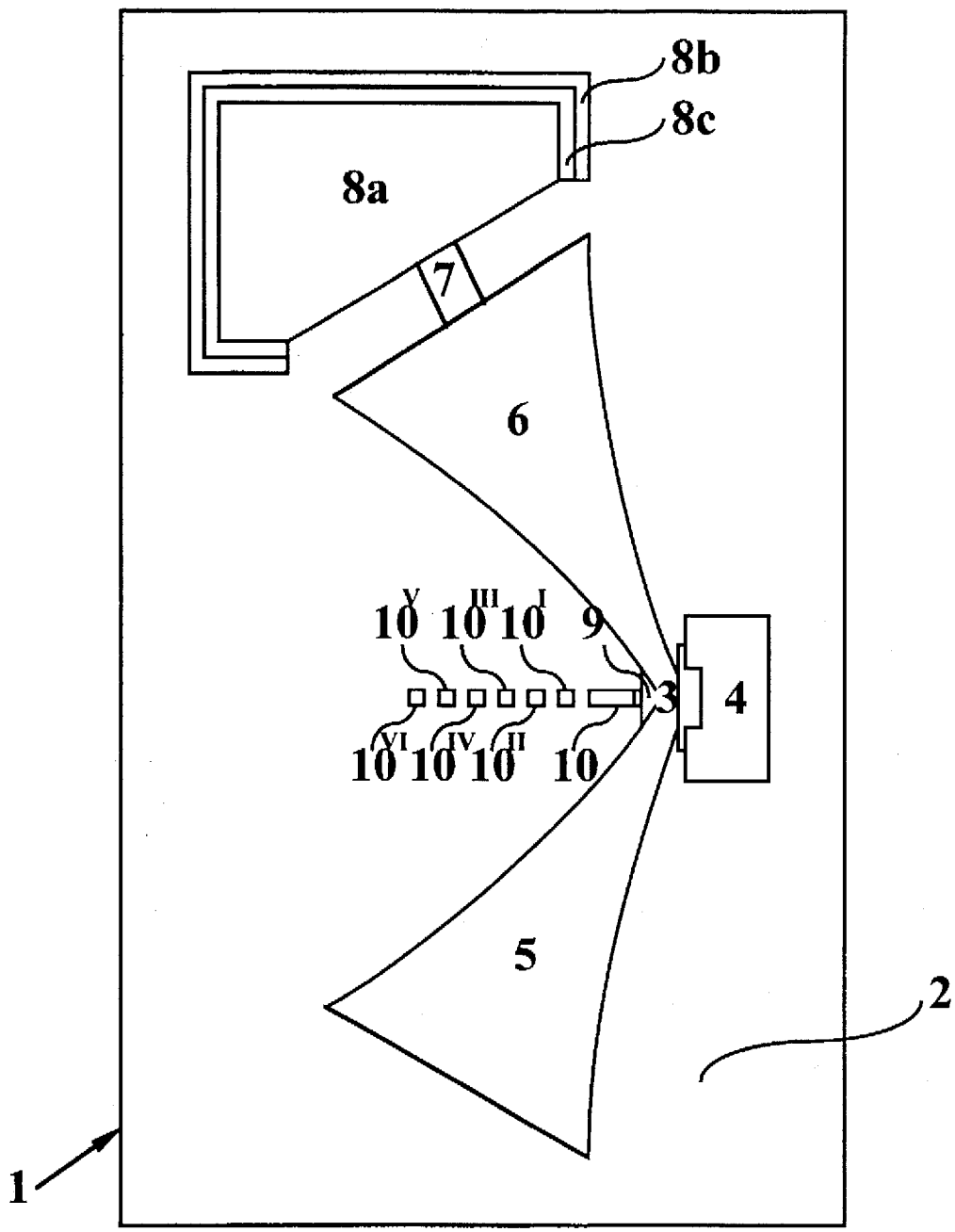
FIG. 1 shows a schematic top view of the oscillator device in accordance with a first embodiment of the present invention.

FIG. 1 is a schematic top view of a microwave or millimeter wave oscillator device or circuit 1 in accordance with a first preferred embodiment of the present invention which may be used as a transmitter, a receiver or a transceiver or be part of another electronic device. The oscillator circuit 1 includes a high frequency circuit (diode circuit) and a low frequency circuit (biasing circuit). The high frequency circuit includes a substrate 2 with a resonant tunnel diode (RTD) having a top contact 3 and a back contact 4. The back contact 4 may be connected by means of a short line to earth, i.e. to a bottom contact electrode of the substrate 2. The diode back contact 4 may include a microstrip closed loop line 4 having an inductive input impedance $L_f$. The loop may have typical dimensions of 0.3×0.5 mm. The diode top contact 3 is electrically connected on one side to a load line 5, preferably having exponential contours, and optionally on the other side to a filter line 6 also preferably having exponential contours. The exponential contours of the load line 5 and the filter line 6 may be the same in order to simplify the design of the masks used for manufacture thereof. A series filter resistance 7 is optionally provided on the substrate 2 for assisting in suppressing low frequency oscillations which may be introduced by the filter line 6. The series resistance 7 is preferably integrated in one of the doped layers used to form the electrodes of the diode. Layers 8a, 8b, 8c form the top electrode, the bottom electrode and the insulation, respectively, of a separate capacitor. An insulating layer 9 insulates the diode top contact 3 from the diode back contact 4.

Two relatively short open microstrip lines 10, 10', 10" . . . $10^{VI}$ are provided on the substrate 2, of which lines 10 and 10' to $10^{VI}$ can be selectively connected together, preferably by means of gold connection lines, in order to change the frequency of the oscillator 1 as required.

Hence, the present invention may also provide a millimeter or microwave oscillator device for a receiver or a transmitter comprising: an active device, a high frequency oscillating circuit including said active device and oscillating at a center frequency, a low frequency biasing circuit connected to said high frequency oscillating circuit, and a tuning circuit for fine tuning the operating frequency of the high frequency oscillating circuit about the center frequency. The fine tuning circuit preferably includes only passive components and may be provided in addition to any frequency sweep circuit which varies the DC voltage of the bias circuit. The tuning circuit preferably includes a variable capacitance provided by an open waveguide with a series of small waveguide sections or stubs linkable with said open waveguide.

Figure 2:
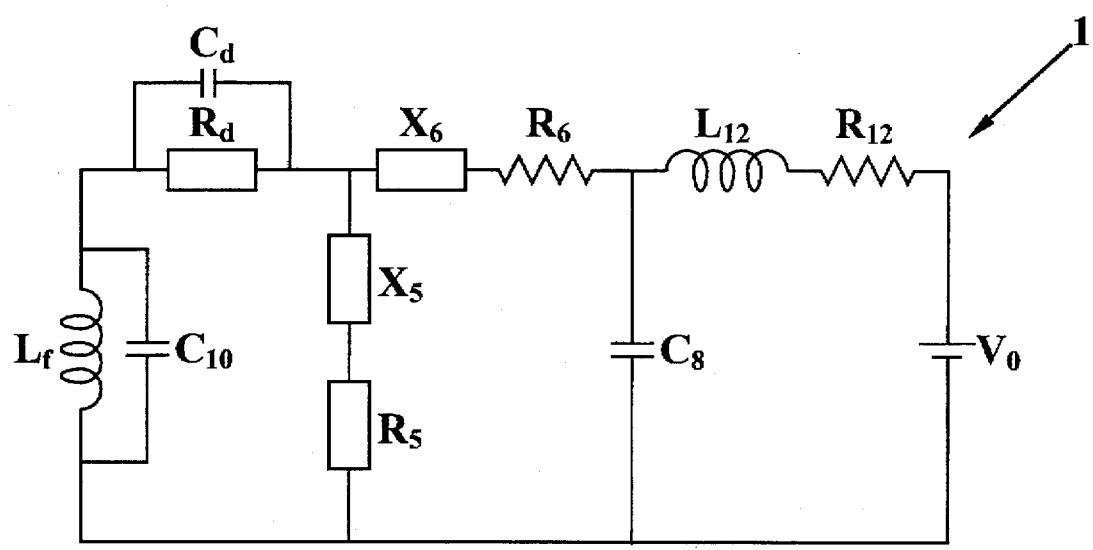
FIG. 2 shows an equivalent circuit of the oscillator device in accordance with the first embodiment of the present invention.

FIG. 2 is a schematic equivalent circuit of the oscillator 1 according to the first embodiment of the present invention. $L_f$ represents the inductance of the connection between the diode back contact 4 and the bottom contact electrode of substrate 2. $C_{10}$ represents the capacitance between the open line and segments $10-10^{VI}$ which can be added to the circuit 1 to change the frequency. The resonance frequency, which is determined by $L_f$ and $C_{10}$, is much greater than the operating frequency $f_0$ of the oscillator 1 so that below the resonance frequency the group $C_{10}$ and $L_f$ is equivalent to an inductance with a value smaller than $L_f$. Accordingly:

$$C_{to} \ll \frac{1}{(2\pi)^2 L_f f_0^2}$$

Hence, the inductance $L_f$ has the value given by:

$$L_f \leq \frac{1}{(2\pi)^2 C_d f_0^2}$$

whereby $C_d$ is the capacity of the diode. This capacitance is determined at high frequencies by the depletion capacitance and the surface area of the diode.

The resistance ($R_d$ in FIG. 2) of the RTD is non-linear and may be determined from the measured direct current - voltage characteristics of the diode. This resistance is a differential resistance $R_d$:

$$R_d = \frac{dV_d}{dI_d}$$

whereby $V_d$ and $I_d$ are the voltage and current across the RTD, respectively.

$R_5$ and $X_5$ represent the resistance and the reactance of the load line 5, respectively. The use of an exponential load line makes it possible to obtain a high resistance with a small parasitic capacitance. $X_6$ and $R_6$ together represent the impedance seen by the RTD from the transform of the series resistance 7 by the filter line 6. Without the exponential contour of the filter line 6, the resistance 7 of FIG. 1 has to be made large to suppress low frequency oscillations and may cause biasing problems.

The separate capacitor $C_8$ is provided to suppress low frequency oscillations in the biasing circuit. $L_{12}$ and $R_{12}$ represent the inductance and resistance, respectively, of the wires connecting the biasing circuit having a biasing voltage $V_0$ to the high frequency circuit.

The oscillating frequency is mainly determined by $L_f$, $C_d$ and $C_{10}$ but also by parasitic capacitances represented by $X_5$ and $X_6$ which are still effective at high frequencies. The filter line 6 is provided to separate the low frequency circuit from the high frequency circuit.

In FIGS. 3A–3I the different manufacturing steps to produce a high frequency integrated resonant tunneling diode in accordance with the first embodiment of the present invention are shown schematically for one device. The skilled person would understand that a plurality of such devices could be manufactured on a wafer at one time. Only five masks are required. The device may be produced monolithically or pseudo-monolithically. The processing steps include:

1a) Highly doped diode GaAs layer 21 and doped diode GaAs layers 22 for the tunneling diode are grown on top of an undoped GaAs substrate 20 (FIG. 3A) having a thickness of, for example, about 450 µm and a resistivity of less than 0.0001 Ωcm by means of standard epitaxial techniques such as molecular beam epitaxy (MBE).

1b) The mesa 22' of the diode (FIG. 3B) is formed by etching through the doped GaAs layer 22 and up to the doped GaAs layer 21 (use of first mask). This etch is preferably shallow to reduce the parasitic series resistance introduced by the diode itself. This first mesa etch provides the top contact of the diode.

1c) In a second mesa etch (FIG. 3C), parts of highly doped layer 21 are etched up to the undoped substrate 20 (use of second mask). It is important that during this second etch a low value for leak currents in the device is ensured. This second mesa etch provides the back contact 21', 21" of the diode. During this etch the integrated filter resistance is constructed (7 in FIG. 1).

Optionally, the vertical diode on the mesa can be transferred at this point by epitaxial lift-off (ELO) to any other desired substrate (for example an MCM-D thin film substrate) by selectively etching (in a solution of 1:10 HF:$H_2O$) a thin (e.g. 50 nm) AlAs layer (not shown) sandwiched between the high-doped GaAs bottom contact 21', 21" of the RTD and the semi-insulating substrate 2. After transfer, steps 1d to 1i may be carried out on the new substrate.

1d) A first metal deposition is patterned by means of lift-off technology (FIG. 3D) resulting in conductive portions 24 and 25 (use of third mask) which determine the conductive (e.g. ohmic) contacts for the RTD, the ground electrode (8b of FIG. 1) of the separate capacitor $C_8$ (see FIG. 2) which is connected to the back contact of the RTD, the contacts for the integrated filter resistance (7 in FIG. 1), the filter line (6 of FIG. 1) and the contact for the load line (5 of FIG. 1).

Figure 3A:
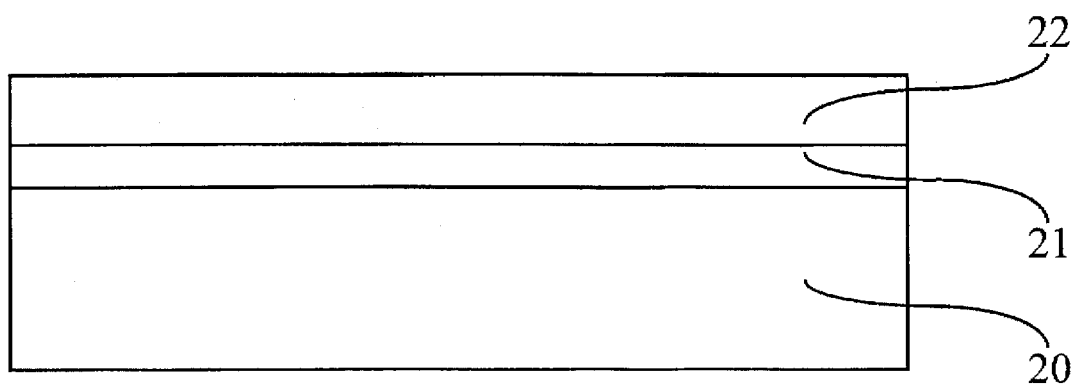
FIGS. 3A–3I show cross-sections through the substrate of the oscillator device in accordance with the first embodiment of the present invention for different manufacturing steps.
Figure 3B:
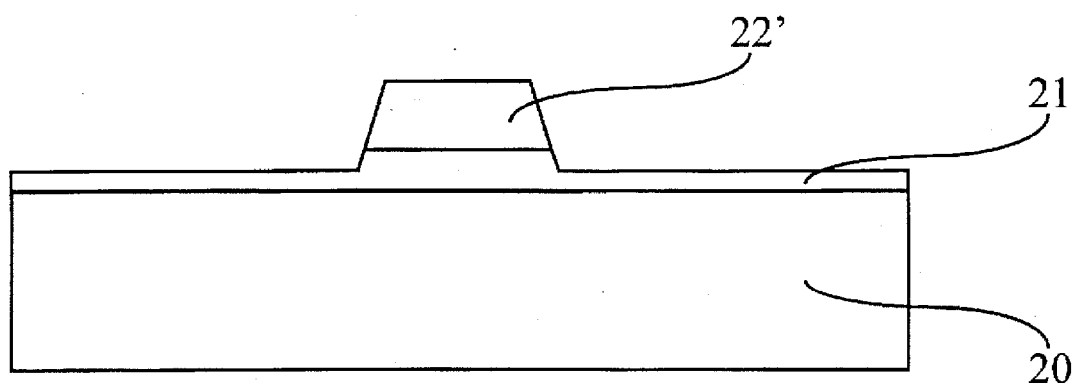
Figure 3C:
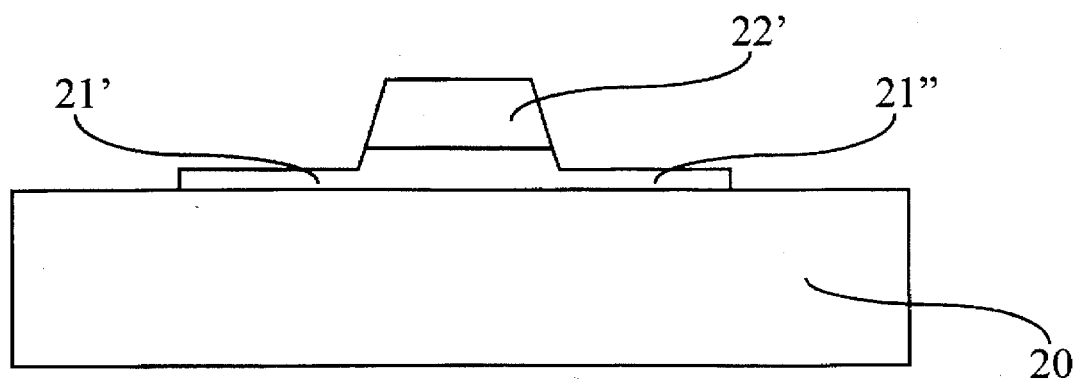
Figure 3D:
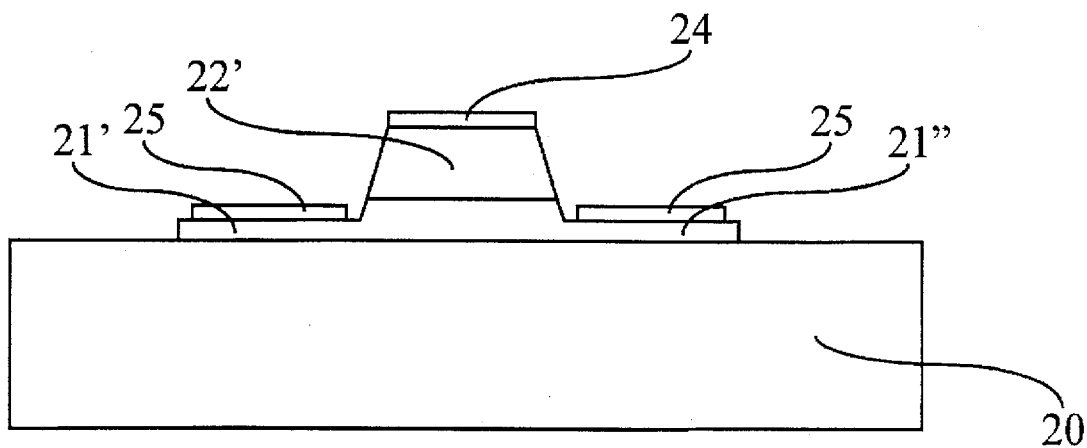
Figure 3E:
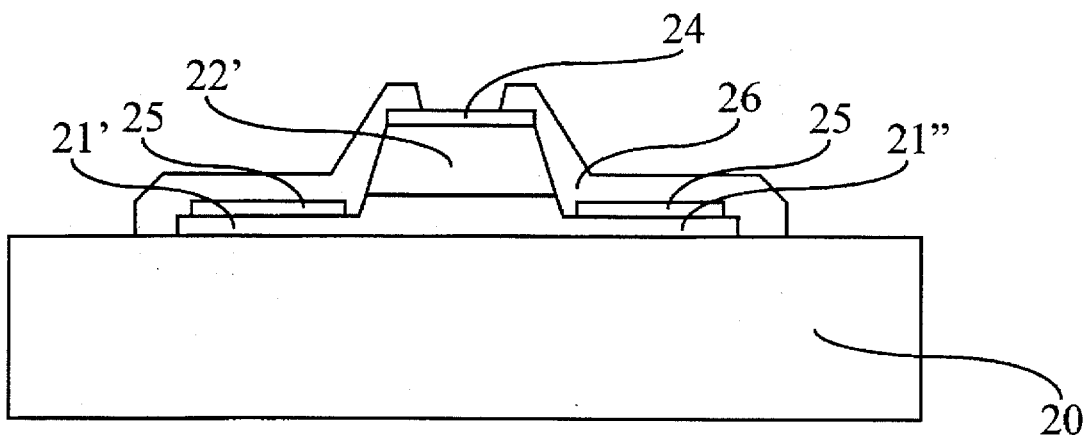
Figure 3F:
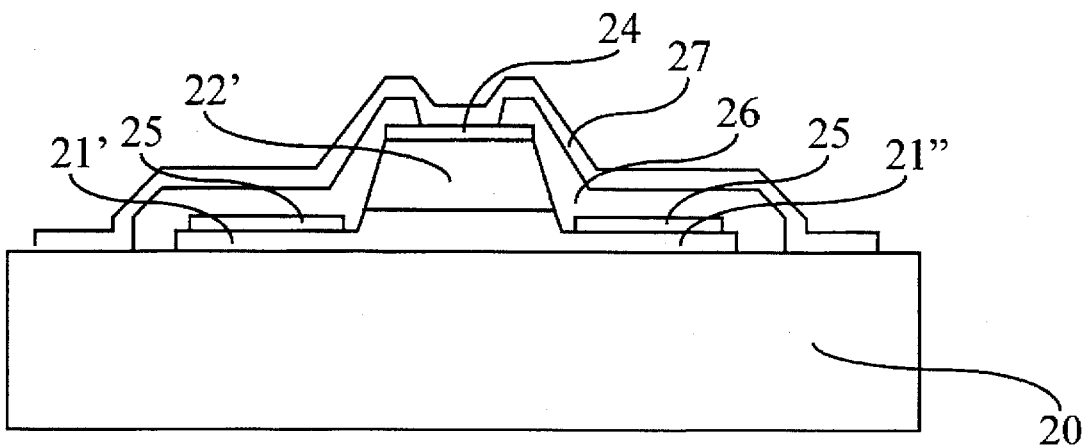
Figure 3G:
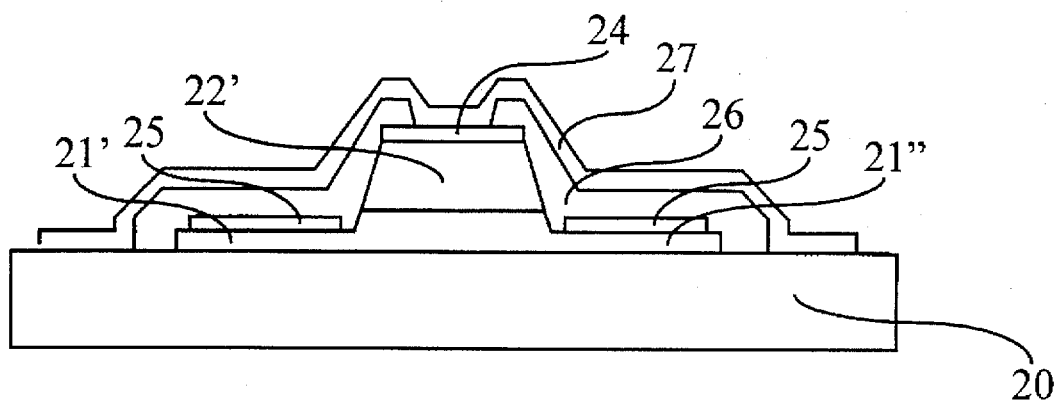
Figure 3H:
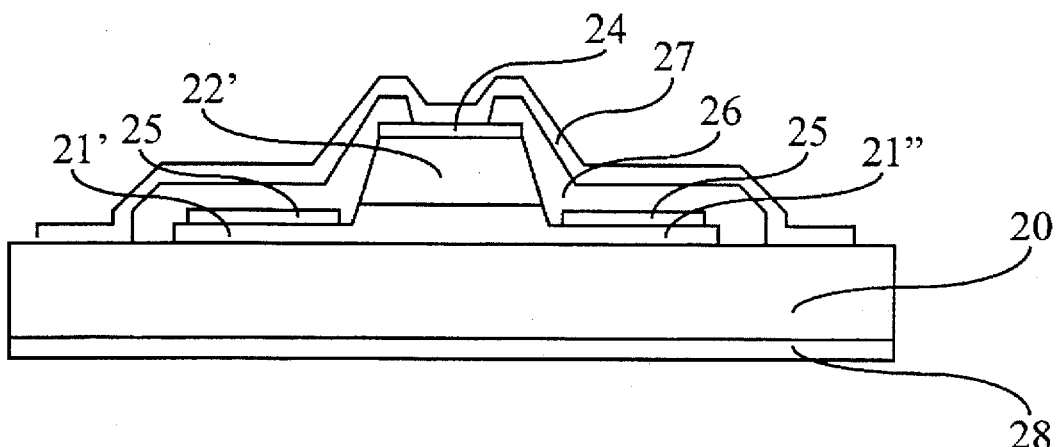

1e) An insulation layer 26 is applied to the structure to separate the top and back contacts of the diode as best shown in FIG. 3E and patterned to form the dielectric (8c of FIG. 1) for the capacitor $C_8$ (use of fourth mask). The insulation layer 26 is opened on the mesa top, at the bottom contacts of the diode and at the contacts of the series resistance 7. The material of the dielectric has preferably a low dielectric constant in order to reduce parasitic capacitance around the diode. Polyimide or nitride is preferred for the insulation layer. Other materials may be stress free polyimide layers, or benzocyclobutene BCB, polyphenylquinoxaline, polyimide iso-indoloquinazolinediones, fluorinated polyimide, silicone polyimide, acetylene terminated polyimide. Suitable materials have a dielectric constant of between 2 and 4, have low water uptake, low dielectric loss and may be planarized. Preferably they can be spun up to a thickness of 10 to 20 µm.

1f) A second metal layer 27 is deposited (FIG. 3F) for defining the closed microstrip line (4 of FIG. 1), the microstrip lines (5, 6, 10, 10'–10$^{VI}$ of FIG. 1) and the top electrode (8a of FIG. 1) of integrated capacitor $C_8$ (use of fifth mask).

1g) The undoped GaAs substrate 20 is thinned (FIG. 3G), for example, to a thickness of about 200 µm. The thinning may be done using a bubble etch method in which the etch liquid is an $H_2SO_4$:$H_2O_2$:$H_2O$ mixture with a concentration of 1:8:500 respectively and kept at room temperature during the etch. Nitrogen gas is blown through the liquid and the substrate is rotated with a constant velocity.

1h) A metallic layer 28 is deposited on the bottom of the substrate 20 (FIG. 3H) to form a reference plane.

Figure 3I:
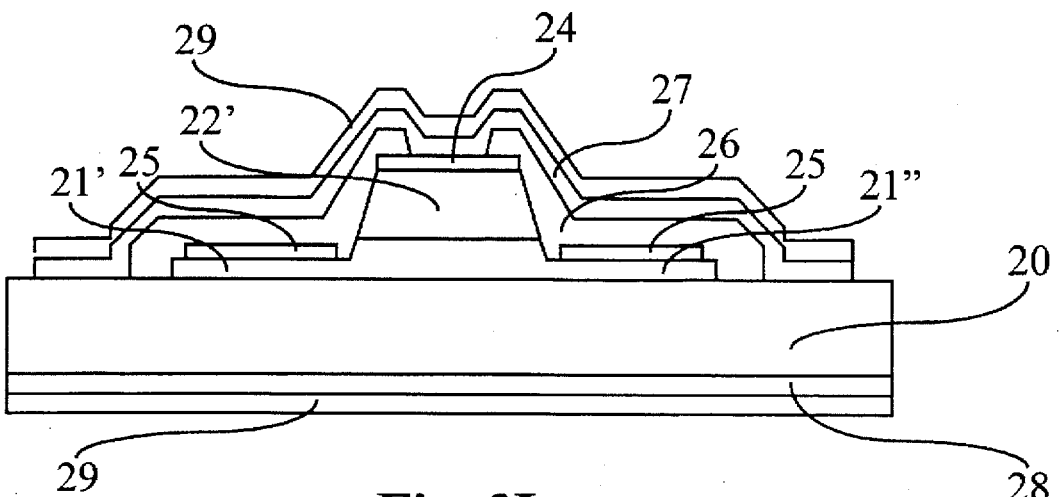

1i) Optionally, the same mask as used in step 1f) may be used to open windows for depositing contact areas electrochemically, e.g. a first resist layer is deposited and exposed so that it covers a part of the underlying ohmic contact area, a TiW/Au/TiW contact is grown, a second resist layer is deposited and exposed such that the window is larger than the underlying resist window and finally gold is deposited electrochemically (FIG. 3I). Alternatively this step can be carried out with step f). Finally, a metal, e.g. gold contact layer 29 is electrochemically deposited on layers 27 and 28.

The wafer can be diced into individual oscillator circuits. After dicing, the desired connection lines, e.g. for the connection of both the bottom contact 21', 21" of the RTD and the capacitor bottom electrode to the bottom contact plate 29, silver paste lines or short bonding wires may be used. The wires from the biasing circuit can be connected by means of standard bonding techniques to the top electrode of the capacitor and the bottom contact plate.

In the design of the oscillator device 1 in accordance with the first embodiment, one or more of the following is achieved:

optimum power output efficiency, avoiding low frequency oscillations, specified oscillating frequency, optimum load to extract the power, minimum dissipation of power in microstrip lines.

The design starts with the characterization of the RTD. This diode is preferably constructed such that the differences between the peak and the valley voltages and currents are as large as possible to generate maximum power. After having grown candidate RTD's (without additional circuit components, e.g. up to step 1d above), their direct current - voltage characteristics are measured and/or calculated. It is sufficient to measure the capacitance of the diodes at low frequencies. The capacity of the diode is mainly determined by the surface area of the diode. From the current - voltage characteristic of the diode all parameters required for the circuit can be calculated. These parameters are almost independent of frequency up to millimeter wave frequencies. On the basis of the calculations, drawings are made and a set of masks is prepared for manufacturing the oscillator circuit.

Figure 4:
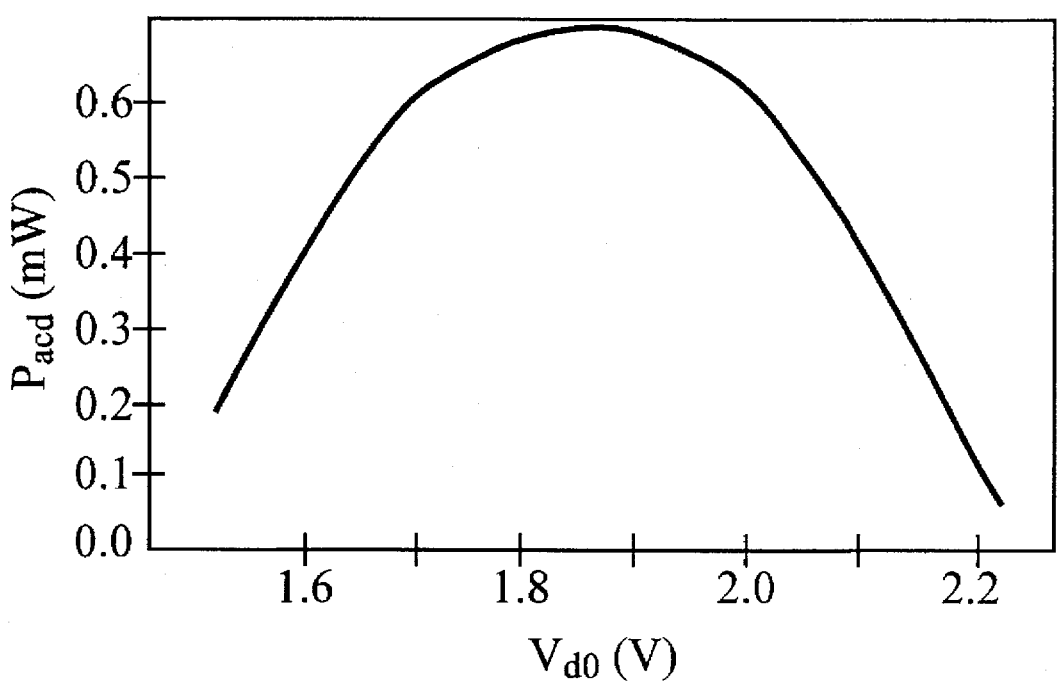
FIGS. 4 to 9 show graphs of the electrical properties determined for the oscillator device in accordance with the first embodiment of the present invention.

As an example, the power $P_{acd}$ (in mW) generated by the RTD is calculated as a function of the bias voltage over the diode $V_{do}$ (as given in FIG. 4) from the measured RTD current voltage characteristic based on sinusoidal oscillations. For the device shown in FIG. 4, the negative differential resistance of the RTD lies in the range 1.58 and 1.84 Volt. The parasitic capacitance $C_d$ of the RTD in this example is 0.8 pF at a frequency of 23 GHz. As can be seen from FIG. 4, with this particular example the maximum power generation lies outside the negative differential resistance region but the invention is not limited thereto. It is preferred if the RTD is not operated within the positive differential resistance region, as small changes in the load or circuit can result in instabilities which can stop or change the oscillation. The diode bias voltage $V_{do}$ is preferably chosen in the negative differential resistance region for achieving stable operation.

Figure 5:
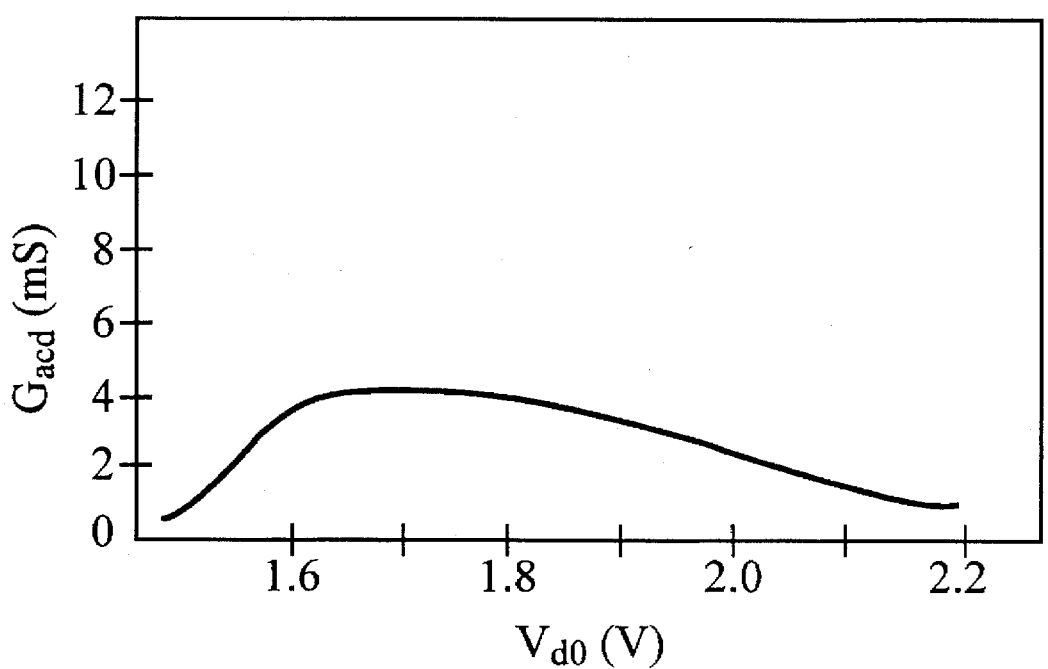

FIG. 5 shows the oscillation conductance $G_{acd}$ (in milli-Siemens) as a function of the diode bias voltage $V_{do}$ in Volt. $G_{acd}$ is twice the slope of the curve of the generated power ($P_{acd}$) of the RTD versus the square of the oscillation voltage amplitude $V_{acd}$ across the RTD. The optimum oscillation conductance $G_{acd}^{opt}$ is given by:

$$G_{acd}^{opt} = \frac{2P_{acd}^{max}}{V_{acd}^{2\,opt}}$$

wherein $P_{acd}^{opt}$ is the maximum power of the fundamental (1st harmonic) generated by the RTD and $V_{acd}^{opt}$ represents the value of the oscillation voltage amplitude $V_{acd}$ across the RTD at the maximum power. The optimum oscillation conductance $G_{acd}^{opt}$ determines the values at which the maximum power is supplied to the circuit load, e.g. radiated into free space if the load is an antenna. $P_{acd}^{max}$ is given by: $P_{acd}^{max} = 3/16\, \Delta I \Delta V$ if the non-linear current-voltage characteristic of the RTD is approximated by a polynomial of the third degree.

Figure 6:
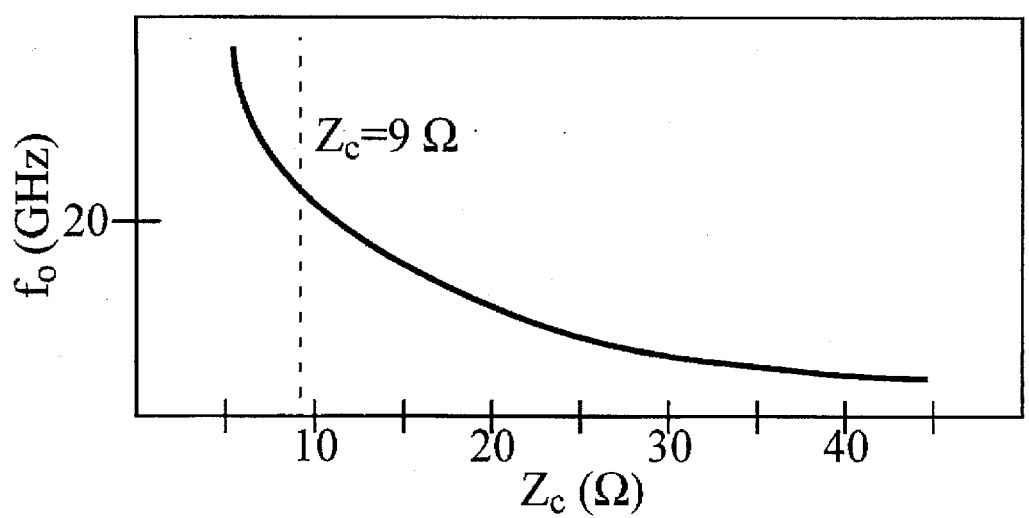

FIG. 6 shows the relationship between the characteristic impedance $Z_c$ of the resonator and the oscillation frequency $f_0$ which is defined by:

$$f_0 \leq \frac{1}{2\pi Z_c C_d}$$

The characteristic impedance is defined as:

$$Z_c = \sqrt{\frac{L_f}{C_d}}$$

Figure 7:
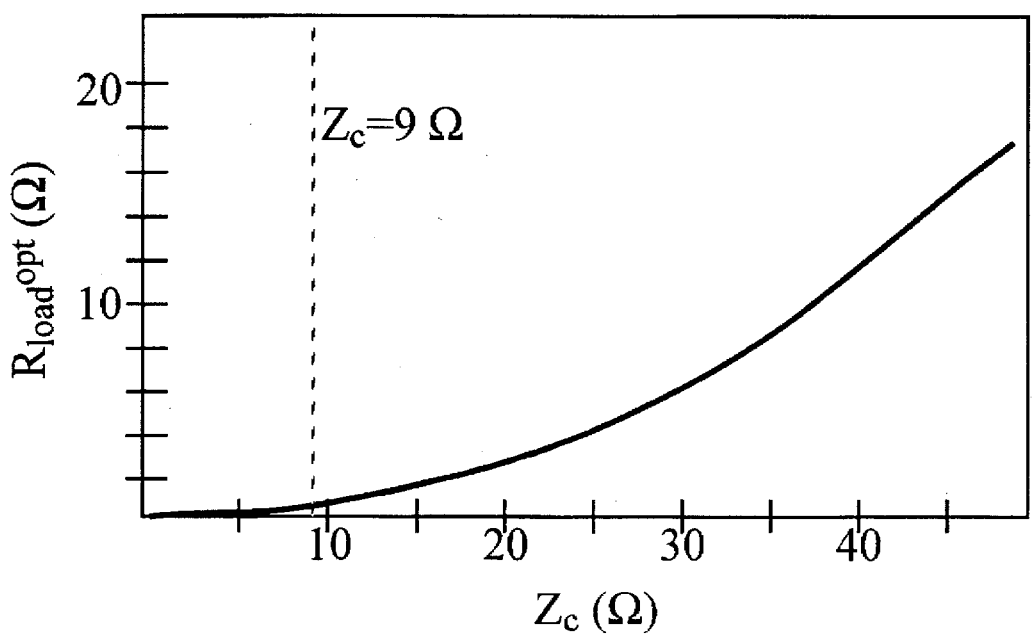

FIG. 7 shows the optimum value of the load as a function of the characteristic impedance $Z_c$. The optimum value $R_{load}^{opt}$ for the total load ($R_5$ and the parasitic $R_6$) is calculated from the optimum oscillation conductance $G_{acd}^{opt}$ and the characteristic impedance:

$$R_{load}^{opt} = 2G_{acd}^{opt} Z_c^2$$

Figure 8:
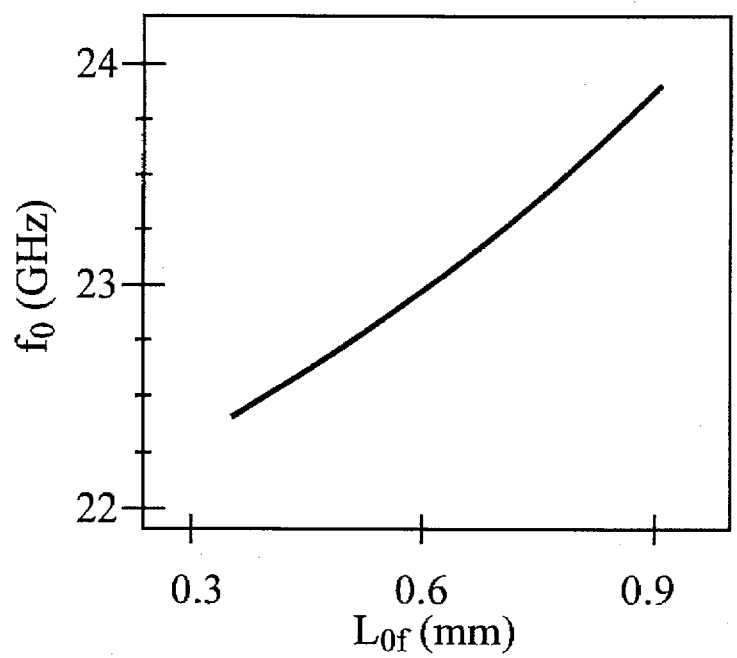
Figure 9:
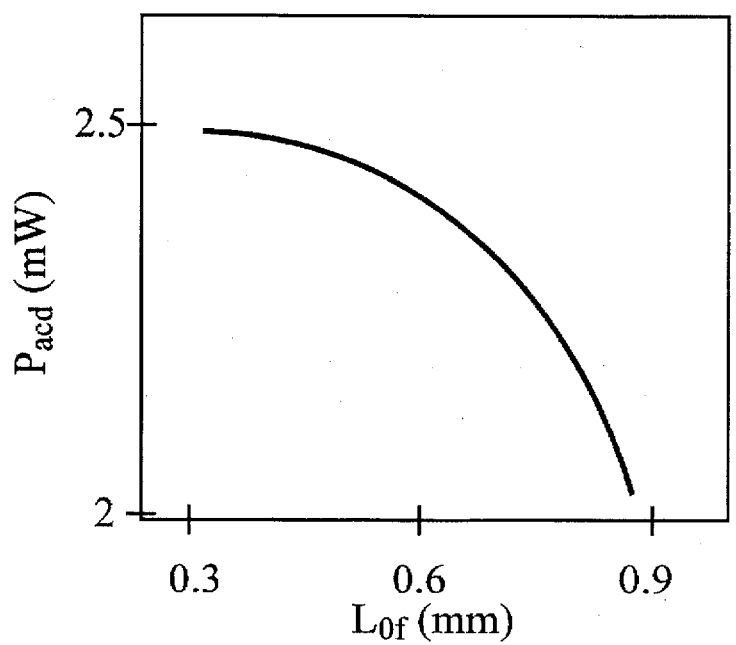

FIGS. 8 and 9 show the oscillation frequency and the power delivered, respectively, as a function of the length $L_{of}$ of the open line 10. The operating frequency can be varied by means of the open microstrip line segments $10'$–$10^{VI}$ in step-wise fashion about the center frequency.

EXAMPLE

For the parameters of the equivalent circuit shown in FIG. 2 and operating at a operating oscillator frequency $f_0$ of 23.6 GHz the following values have been found:

$L_f$ has a length of 0.3 mm and a width of 0.5 mm $C_{10}$ has a maximum length of 3 mm and a width of 60 μm $C_d$=0.8 pF $X_5$=0 at $f_0$ (start width of 60 μm, length of 1.4 mm, cut-off frequency of 9 Ghz)

$X_6$=0 at $f_0$ (start width of 60 μm, length of 1.4 mm, cut-off frequency of 9 Ghz)

$R_5$=0.6 Ω at $f_0$ $R_6$=3 Ω (mainly due to the series resistance 7)

$L_{12} \leq 10$ nH $R_{12} \geq 1$ Ω

$C_8$=1 nF $V_0$=1.58–1.84 V

The design of the oscillator circuit 40 in accordance with a second embodiment of the invention, which may be used in a transmitter, receiver, transceiver or other circuits, also starts from the characterization of the resonant tunneling diode. This diode may be constructed such that the difference between the peak and valley voltage and current are as large as possible to generate maximal power. Out of the DC current voltage characteristics of the RTD, the ideal bias voltage and load resistance of the RTD for generating maximum output power can be determined. For determining the oscillation frequency a complete parameter extraction of the RTD by doing S-parameter measurements on the coplanar waveguide 49 is preferred. The frequency of the RTD oscillator may be swept by changing the DC bias across the RTD.

Figure 10B:
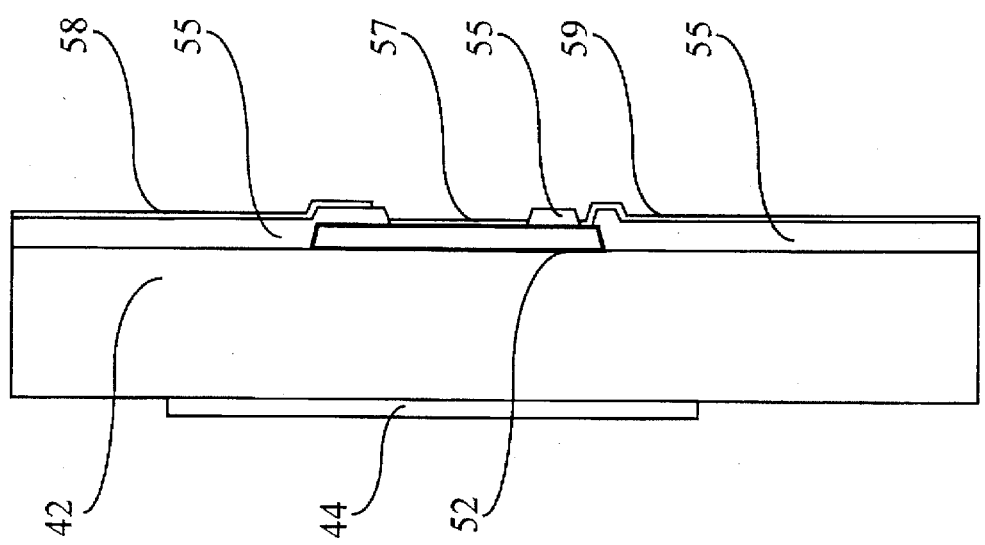
FIGS. 10A and 10B show a schematic top view and a cross-section respectively of the oscillator device in accordance with a second embodiment of the present invention.
Figure 10A:
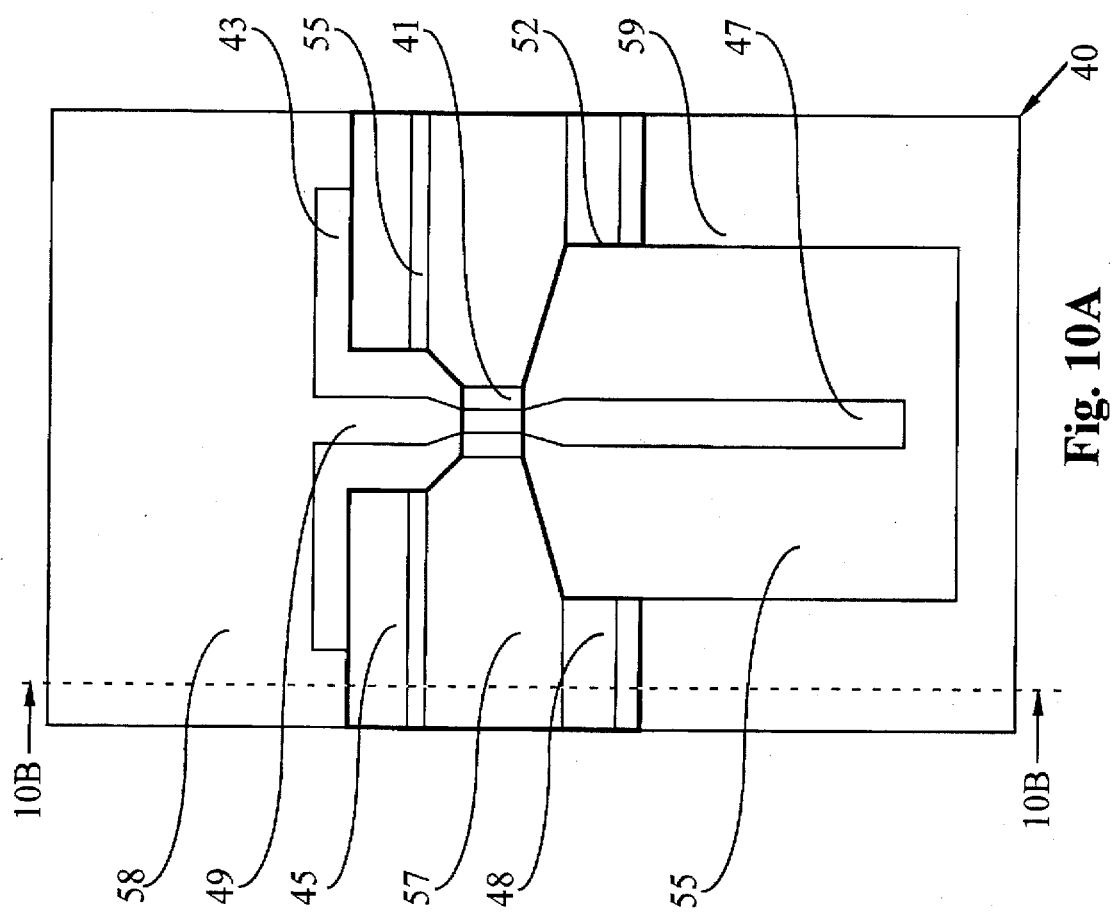
Figure 11A:
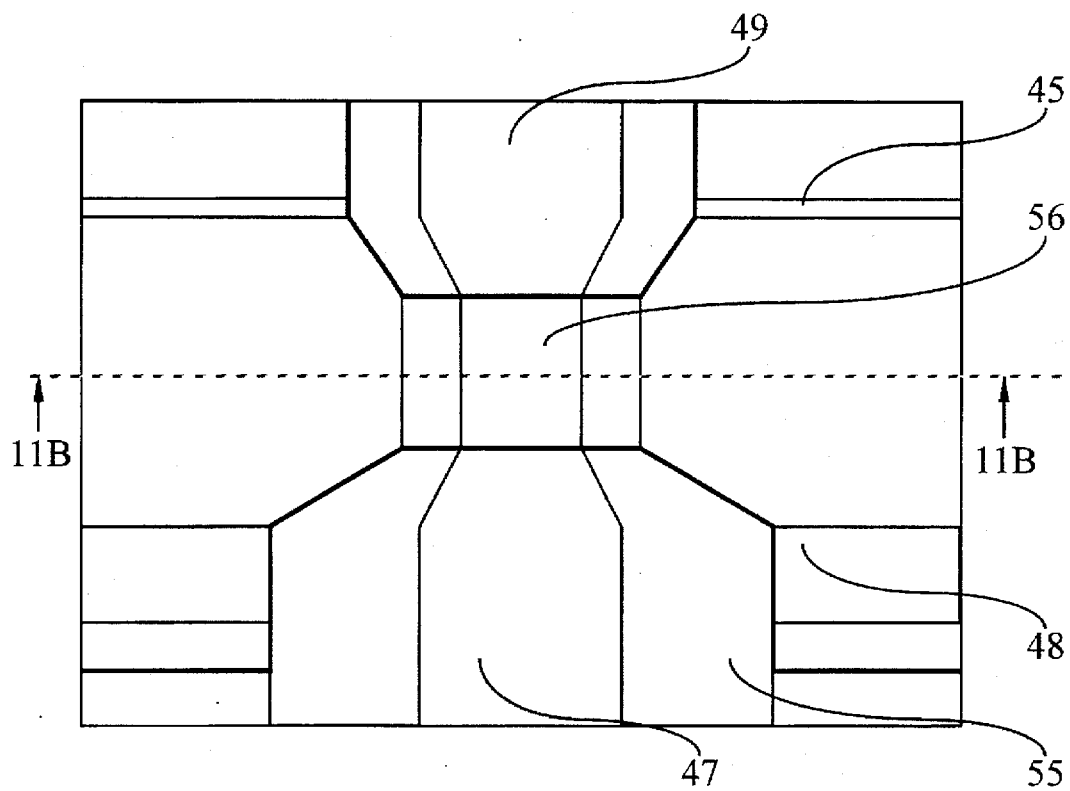
FIGS. 11A-11B show a schematic top view and a cross-section, respectively of the oscillator device in accordance with a second embodiment of the present invention.
Figure 11B:
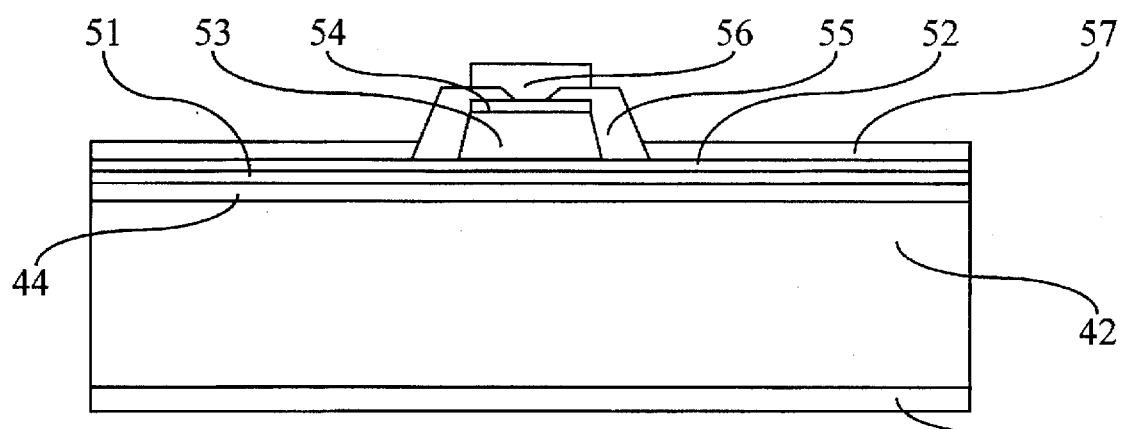

The oscillator circuit 40 according to the second embodiment is shown schematically in a top view in FIG. 10 and FIG. 11A and in cross-section in FIG. 10B and FIG. 11B. In accordance with both the first and second embodiments, one of the plates of a large blocking capacitor is connected to the back electrode of the active device for suppression of low frequency oscillations. Whereas with the first embodiment the large capacitor was connected to the top contact of the active device by means of an exponential microstrip line and a resistor, the top plate of the capacitor in accordance with the second embodiment is connected to the top contact of the active device by means of an inductive component of the antenna.

FIG. 10A shows a top view of the oscillating device 40 including an RTD 41. FIG. 10B shows a cross section of a resonant tunneling diode (RTD) 41 contacted with a coplanar waveguide 49, 57 whereby the cross-section is placed asymmetrically with respect to the active device 41 through the decouple capacitor 45. The RTD 41, a decouple capacitor 45, an inductance 47 and a resistance 48 form a low frequency DC feed circuit. The RTD 41, the decouple capacitor 45, an antenna having optionally a slot 43 and a patch 44 (on the other side of the substrate 42 and therefore not shown) form a high frequency circuit. The RTD 41 is grown on a top major surface of a semi-insulating GaAs substrate 42. The active layers 53 of the RTD 41 lie above the highly doped GaAs back contact layer 52. The extent of back contact layer 52 (which would normally not be visible in these views) is indicated in FIGS. 10A and 11B by means of a heavy black line. On top of the active layers 53 a highly doped GaAs top contact layer 54 is deposited (seen best in FIG. 11B). The signal conductor 49 of a coplanar transmission line 49, 57 is connected with the top contact 54 via metallic contact 56 and the ground conductors are connected with the back contact layer 52 through the metal contacts 57 (shown best in FIG. 11B). The coplanar transmission line 49, 57 extends from the RTD 41 and feeds an antenna 43, 44 at higher frequencies. The antenna 43,44 is decoupled at lower frequencies by a decouple capacitor 45 which also makes the circuit stable at lower frequency (preventing parasitic oscillations in the low frequency circuit). In accordance with the invention the decouple capacitor 45 forms part of, and is, therefore connected to the back contact layer 52 of the RTD 41. This allows a large value for the capacitor 45 as the size of the capacitor plates is not limited by the width of the signal line 49. The value of the decouple capacitance 45 can be adjusted by changing the thickness of a passivation layer 55 and by changing the area of the parallel plate decouple capacitor 45. The capacitor 45 has a relatively large parasitic series resistance due to the large losses of the diode back contact layer 52. This large capacitance gives a good low frequency stabilization of the DC biasing circuit for the RTD.

The present invention may also provide a microwave or millimeter wave receiver or transmitter including an oscillator comprising: an active device, a radiating element functioning in use simultaneously as a resonator and an antenna, and a slot antenna connected to said active device and operatively coupled with said radiating element for supplying a microwave or millimeter wave signal to, or receiving a microwave or millimeter wave signal from said radiating element. The radiating element is preferably a patch antenna or a substrate lens. The slot may be coupled inductively or capacitively to the patch or lens. The feed to the slot antenna is preferably by means of a coplanar waveguide.

The present invention may provide a microwave or millimeter wave receiver or transmitter including an oscillator comprising: an active device, an radiating element functioning in use simultaneously as a resonator and an antenna, and a substrate with two major surfaces, said active device being on one said major surface of said substrate and said radiating element being on the other said major surface of said substrate. It is preferable if the antenna is designed to radiate substantially in one direction away from said second major surface of said substrate.

The present invention may also provides a method of fabrication of a transmitter or receiver including a patch antenna, comprising the steps of: providing active layers on a first major surface of a semiconductor substrate, etching said layered semiconductor substrate to form a vertical active device on a mesa on said first major surface, and forming the antenna patch on a second major surface of said substrate.

The antenna 43, 44 is preferably designed as a coplanar fed patch 44. The patch 44 is preferably inductively or capacitively coupled via a slot 43. The coplanar transmission line 49, 57 preferably feeds the slot 43 on one side of the substrate 42. The field generated in the slot 43 feeds a rectangular, preferably square patch 44. The patch 44 in accordance with the present invention is preferably on the opposite major surface of the substrate 42 from the RTD 41 in order to reduce electromagnetic interference between the RTD 41 and electromagnetic waves radiated from the patch antenna 44. This square patch 44 radiates power broadside into free space when it is in resonance. The feed is optimal when the slot 43 and patch 44 are functioning as the resonator for the RTD 41. At that frequency most of the power is radiated to the patch side of the substrate 42 giving an almost unidirectional radiation pattern with low cross-polarization. The signal line 49 of the coplanar transmission line 49, 57 is either connected directly across the slot (as shown in FIG. 10A) or is connected in capacitively (see FIG. 15C ). Hence, the patch 44 may be coupled inductively or capacitively to the slot 43. This antenna 43, 44 has the advantage of a large number of independent parameters which can be tuned to match and optimize the input impedance of the antenna 43, 44 to the RTD 41, e.g. slot length s, slot width, patch size t, position of the slot 43 with respect to the patch 44. The equivalent circuit of this type of antenna is a series resonant circuit of the patch 44 in parallel with an inductance to model the aperture 43. Changing the aperture size or position of the aperture 43 with reference to the patch 44 will change the parallel inductance. In this way the matching of the antenna impedance can be done to adjust the oscillation frequency close to the resonance frequency of the patch 44.

In the very short millimeter wave region, the described antenna may suffer from substrate mode losses when the substrate thickness becomes large compared to the wavelength. Two possible solutions for this are: making the substrate thinner or by replacing the patch of the antenna by a dielectric lens (see FIG. 15D ) which simulates an infinite dielectric.

A large inductance in the bias circuit for the RTD 41 is realized by connecting a high-impedance coplunar waveguide 47 to the metallic top contact 56 of the RTD 41 (best shown in FIG. 10A). The value of the bias circuit inductance can be adjusted by changing the length of the waveguide 47. The series resistance 48 in the DC biasing circuit is realized by using a large rectangular resistance provided by the back contact layer 52 as a mesa resistor (seen best in FIG. 10B below the portion of passivation layer 55). Suitable symmetrical positions for the resistor 48 about the feed inductance 47 are shown in FIG. 10A covered by a portion of the passivation layer 55 (in white). This resistance can be varied by adjusting the length, and/or the width and/or the thickness of the back contact layer 52. The bias circuit inductance 47 and resistance 48 also help to prevent the parasitic oscillations while offering an efficient DC feed structure for the RTD 41.

Figure 12:
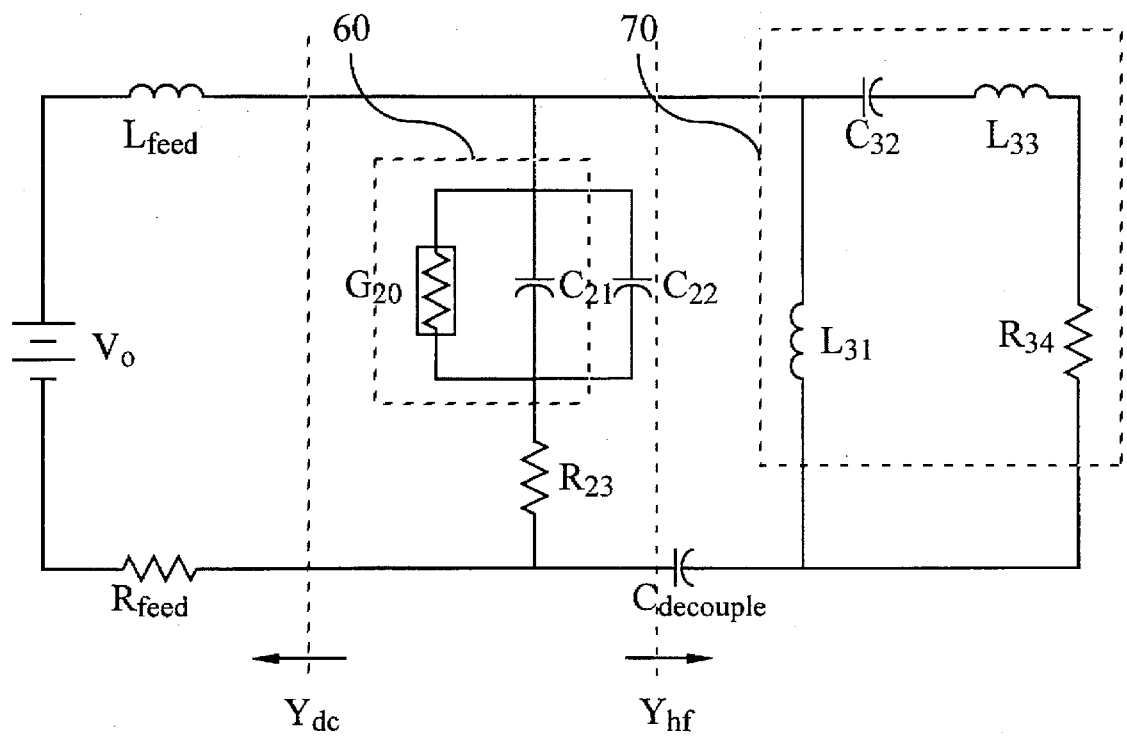
FIG. 12 shows an equivalent circuit of the oscillator device in accordance with the second embodiment of the present invention.

FIG. 12 shows the complete equivalent circuit of the oscillator device in accordance with the present invention. It consists of three parts: the low frequency stabilization and DC feed circuit, the equivalent circuit 60 of the RTD 41 with all parasitics shown and the equivalent circuit 70 of the coplanar fed aperture coupled patch antenna 43,44. The equivalent circuit 60 of the coplanar contacted RTD 41 consists of a non-linear (negative for certain bias voltages) conductance $G_{20}$ (a non-linear resistance to a good approximation) in parallel with a capacitance $C_{21}$. Both the capacitance $C_{21}$ and the conductance $G_{20}$ are dependent on the active RTD area. A parallel parasitic capacitance $C_{22}$ and a series parasitic resistance $R_{23}$ have to be included due to the parasitic effects of the connection of the coplanar waveguide 49 with the active RTD 41. For transit time devices (e.g. a QWITT) this capacitance $C_{21}$ can be approximated by the depletion capacitance of the device. The non-linear conductance for an RTD is almost frequency independent up to a couple of hundred GHz so its behavior can be determined by a simple DC measurement. The parasitic series resistance $R_{23}$ of the device is mainly due to the highly resistive back contact layer 52. The resistance of the total back contact layer 52 can be decreased by making the highly doped back contact layer 52 thicker, by increasing its doping level or by making the area of the back contact layer 52 between active mesa structure 53 and the highly conducting ground contacts 57 very short and broad. This leads for a given active device area to a rather small long shaped active area mesa 53. The parallel parasitic capacitance $C_{22}$ originates from the capacitance between the signal conductor of the coplanar transmission line 49 and the back contact layer 52 on places where there are no active layers 53 in between. This capacitance can be decreased by making the passivation layer 55 between both layers thicker and by reducing the overlap area which contributes to the parasitic capacitance $C_{22}$.

The equivalent circuit 70 of the antenna includes $C_{32}$, $L_{33}$, and $R_{34}$ which represent the series resonant circuit of patch antenna 44 about the resonant frequency. $L_{31}$ represents the inductance of the slot antenna 43 which feeds the patch 44.

Figure 13:
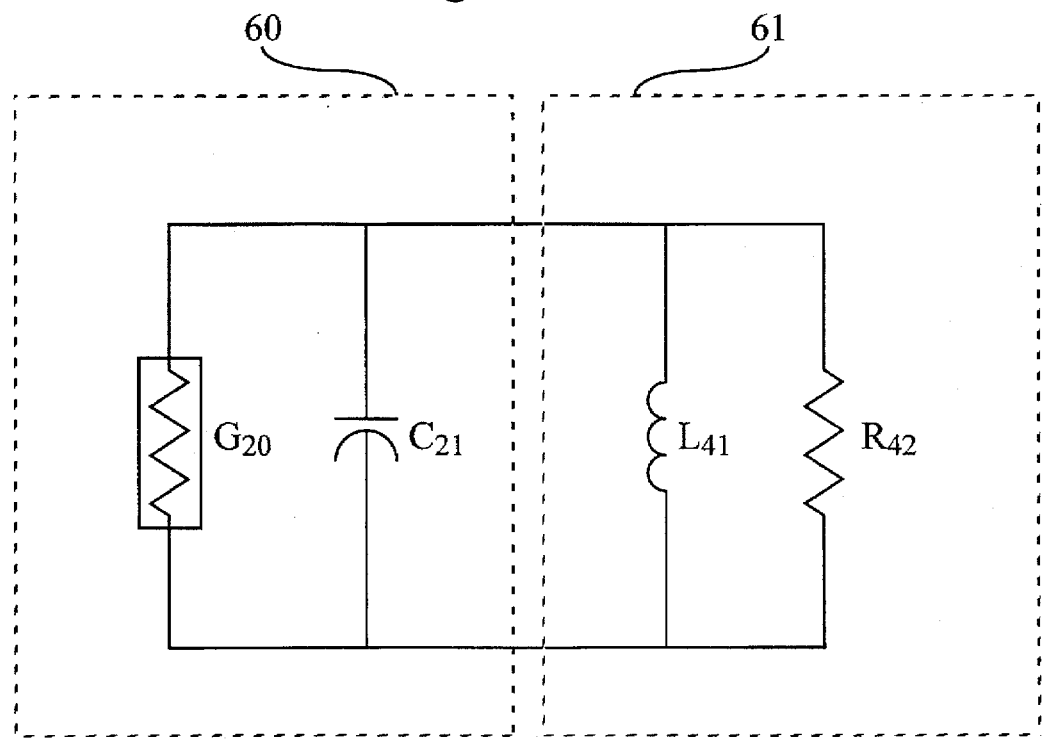
FIG. 13 shows a simplified equivalent circuit of the oscillator device in accordance with the second embodiment of the present invention.

FIG. 13 shows a simplified equivalent circuit diagram of the high frequency circuit 60,61: the RTD equivalent circuit 60 is connected with an ideal load 61 (an inductor $L_{41}$ in parallel with a resistor $R_{42}$) which has to be delivered by the antenna 43,44. The (negative) differential resistance $R_d$ of the RTD 41 is a function of the applied DC bias voltage $V_{d0}$ across the RTD 41 and, due to the non-linearity of the device, also of the signal amplitude $V_{acd}$ of the first harmonic. Out of the non-linear current voltage characteristic of the RTD 41, a large signal conductance $G_{acd}(V_{d0}, V_{acd})$ is determined as a function of the DC bias $V_{d0}$ and the signal amplitude $V_{acd}$. The DC voltage and signal amplitude is chosen which makes the power $$P_{acd}(V_{d0}, V_{acd}) = \frac{G_{acd}(V_{d0}, V_{acd})V_{acd}^2}{2}$$

of the first harmonic a maximum. For these values of the optimal bias voltage $V_{d0}^{opt}$ and the signal amplitude $V_{acd}^{opt}$ also the optimum signal conductance $G_{acd}^{opt}$ (for an RTD 41) can be calculated. The oscillation condition requires that the load admittance:

$$\frac{1}{R_{42}} - \frac{j}{2\pi f_0 L_{41}}$$

has to be exactly the opposite of the source admittance: $G_{acd} + j\, 2\pi f_0 C_d$ (in this case of the RTD 41) at the oscillation frequency $f_0$.

Hence:

$$f_0 = \frac{1}{2\pi \sqrt{C_d L_{41}}}$$

$$R_{42} = \frac{-1}{G_{acd}^{opt}}$$

These two conditions give the optimal load ($R_{42}, L_{41}$) at the optimal bias voltage $V_{d0}$ for the RTD 41. At this optimum condition the optimum power:

$$P_{max}^{opt} = \frac{3}{16} \Delta V \Delta I$$

is delivered. Also the start-up of oscillations is ensured with this load. The large signal conductance $G_{acd}$ decreases with increasing oscillation amplitude $V_{acd}$. Hence, for startup of oscillations, the load conductance $G_{acd}$ is given by:

$$\frac{1}{R_{acd}} \leq -G_{acd}$$

Figure 14:
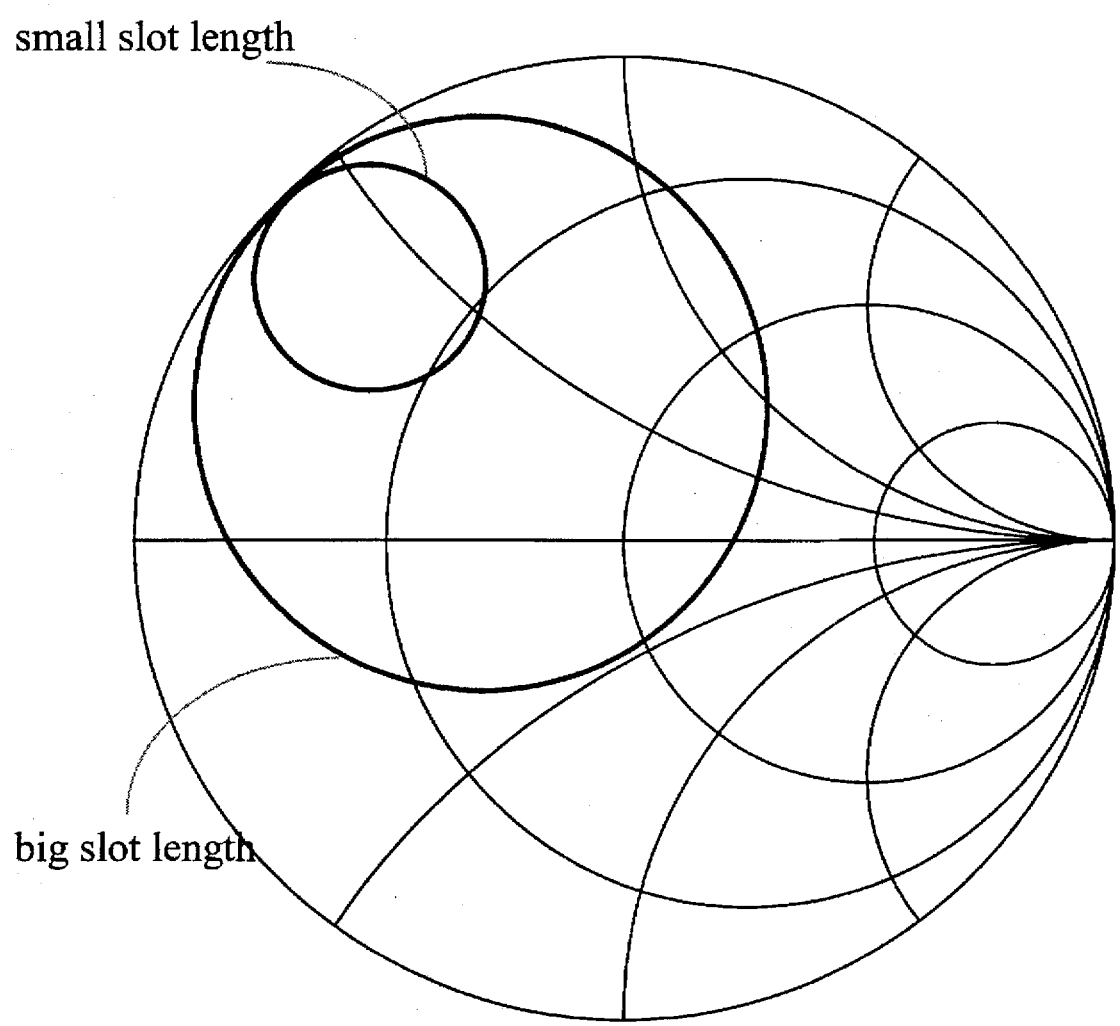
FIG. 14 shows a smith chart of the electrical characteristics of the oscillator device in accordance with the second embodiment of the present invention.

For more accurate calculations the ideal antenna load impedance equivalent circuit 61 may be replaced by the equivalent circuit 70 of the antenna (FIG. 12). The matching of the antenna impedance to the RTD impedance may be realized around the resonance frequency of the patch antenna 43,44: the oscillation frequency and the resonance frequency of the patch must be close together to get the best radiation efficiency and lowest cross polarization. The size of the patch is largely determined by the oscillation frequency of the transceiver. The antenna according to the present invention has the marked advantage that the impedance of the antenna can be not only matched but also optimized to the RTD impedance, independently of its resonant frequency. The tuning parameters available are the slot length, slot width and (to some extent) the substrate thickness. The influence of the slot length s on the antenna admittance is shown on a Smith chart in FIG. 14. The resonance characteristic is rotated along the outer circle of the Smith chart due to the feed through the GaAs substrate. The rotation can be adjusted by changing the ratio of thickness of the substrate to the wavelength. A substrate with a higher ratio will rotate the characteristic further to the right. By making the slot length s bigger, the resonance circle on the Smith chart will also become larger. These two methods may be used to match the admittance of the antenna with the RTD at resonance. Changing the slot length s provides matching of the RTD and the antenna when the substrate thickness can no longer be altered.

The DC feed circuit in accordance with the present invention will be described with reference to FIGS. 12 and 13. The circuit is designed to be stable at low frequencies and consists of two parts: one to feed the bias voltage to the RTD (feed inductor and resistor) and a second to decouple the high frequency circuit from the bias circuit (decouple capacitor between RTD and high frequency load). The values of decouple capacitor $C_{decouple}$, feed inductor $L_{feed}$, and feed resistor $R_{feed}$ have to be chosen so that no low frequency oscillations can occur. This can be calculated as follows.

At low frequencies the only feed of the RTD 41 has to be the bias circuit. No DC current may flow through the HF circuit so as to prevent a large DC power loss and so a large decrease in efficiency. The total load admittance $Y_{load}$ of the RTD at lower frequencies is calculated. This admittance is the sum of the DC feed admittance $Y_{DC}$ and the HF admittance $Y_{HF}$ (see FIG. 12).

From FIG. 12 we see that:

$$Y_{DC} = \frac{1}{R_{feed} + j\omega L_{feed}}$$

and:

$$Y_{HF} = \frac{1}{Z_{HF} + \frac{1}{j\omega C_{decouple}}}$$

The high frequency admittance can be approximated at lower frequencies by a simple decouple capacitor:

$$Z_{HF} \ll \frac{1}{j\omega C_{decouple}}$$

as $Z_{HF}$ for low frequencies (see antenna impedance FIG. 12).

Hence at low frequencies:

$$Y_{load} = \frac{1}{R_{feed} + j\omega L_{feed}} + j\omega C_{decouple}$$

To have oscillations at low frequencies the load admittance has to satisfy following two conditions:

$$Re(Y_{load}) \leq -G_{acd}^{small}$$

$$Im(Y_{load}) = -107 \, C_d$$

With $G_{acd}^{small}$ the small signal RTD conductance for the given bias voltage. Using equation 2 the parasitic oscillation frequency $f_{parasitic} = \frac{1}{2\pi} \omega$ can be determined from:

$$\omega = \sqrt{\frac{1 - \frac{R_{feed}^2 C_{tot}}{L_{feed}}}{L_{feed} C_{tot}}}$$

where $C_{tot} = C_{decouple} + C_d$ which is approximately equal to $C_{decouple}$ if $C_{decouple}$ can be made large.

This has to be real to have oscillations. Hence, no low frequency oscillations occur when:

$$\frac{L_{feed}}{C_{decouple}} \leq R_{feed}^2$$

When $\omega$ is real, equation 1 yields a second equation for low frequency stability:

$$\frac{L_{feed}}{C_{decouple}} \leq \frac{-R_{feed}}{G_{acd}^{small}}$$

If one of both previous equations is satisfied no low frequency oscillations can occur. To generate a stable DC feed of the RTD, $1/R_{feed}$ has to be larger than $|G_{acd}^{small}|$. This leads to the final condition for low frequency stability:

$$C_{decouple} \geq \frac{-L_{feed} G_{acd}^{small}}{R_{feed}}$$

In accordance with the present invention the decouple capacitor may be provided not in the signal line but in the back contact 52 of the RTD 41. This has the advantage that even large values of $C_{decouple}$ may be achieved with monolithic or pseudo-monolithic manufacturing methods. Forming the decouple capacitor from the signal line has the disadvantage that the signal line is conventionally narrow and a large capacitor can not be formed easily therefrom.

This DC feed structure may also have no influence on the high frequency performance of the oscillator. At high frequencies the only load which should be seen by the RTD is the admittance of the HF circuit. The total load admittance of the RTD can now be approximated by:

$$Y_{total} = \frac{1}{j\omega L_{feed}} + Y_{HF}$$

with $Y_{HF}$ representing the admittance of the combined antenna circuit 70 and the decouple capacitor (see FIG. 12):

$$Y_{HF} = \frac{1}{j\omega L_{41}} + \frac{1}{R_{42}}$$

The influence of the DC bias circuit can be neglected when:

$$L_{feed} > L_{41}$$

The resistance $R_{feed}$ in the DC bias circuit is a trade-off between the DC loss and hence decrease in efficiency resulting from a larger resistance and the better low frequency stability when using a larger resistance in the feed circuit. The feed resistance $R_{feed}$ must however always be smaller then $-1/G_{acd}^{small}$ to allow the DC biasing in the negative differential resistance zone of the RTD.

Figure 15A:
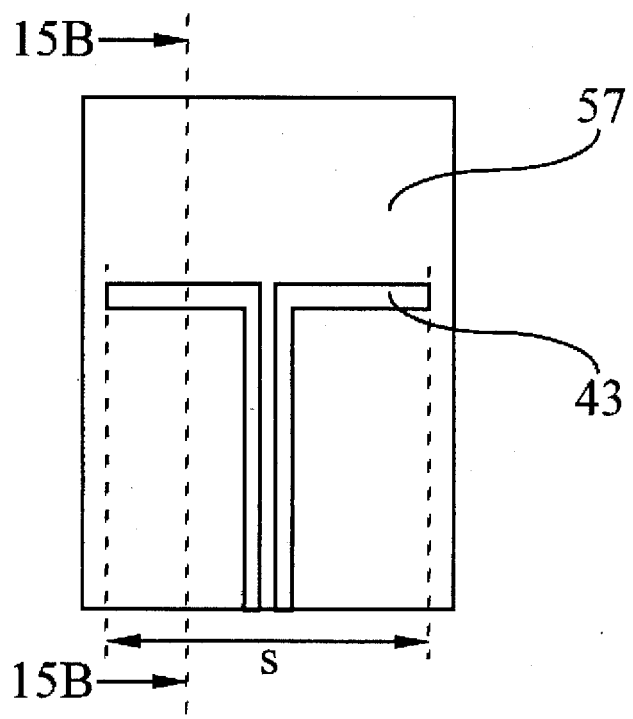
FIG. 15A to 15D show details of the antenna elements of the oscillator device in accordance with the second embodiment of the present invention.
Figure 15B:
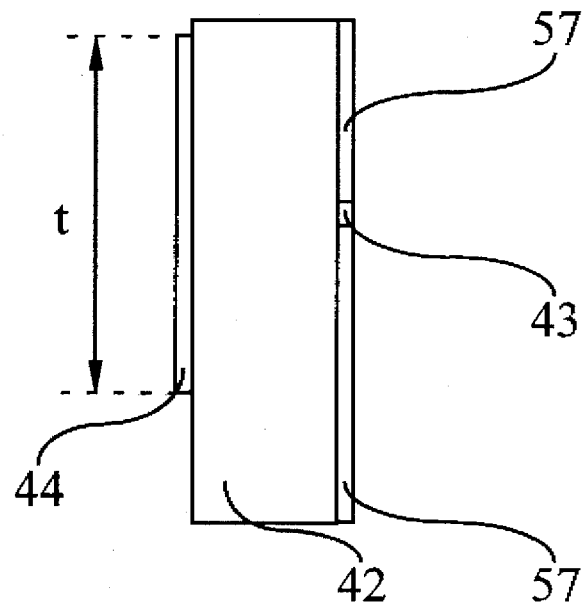
Figure 15C:
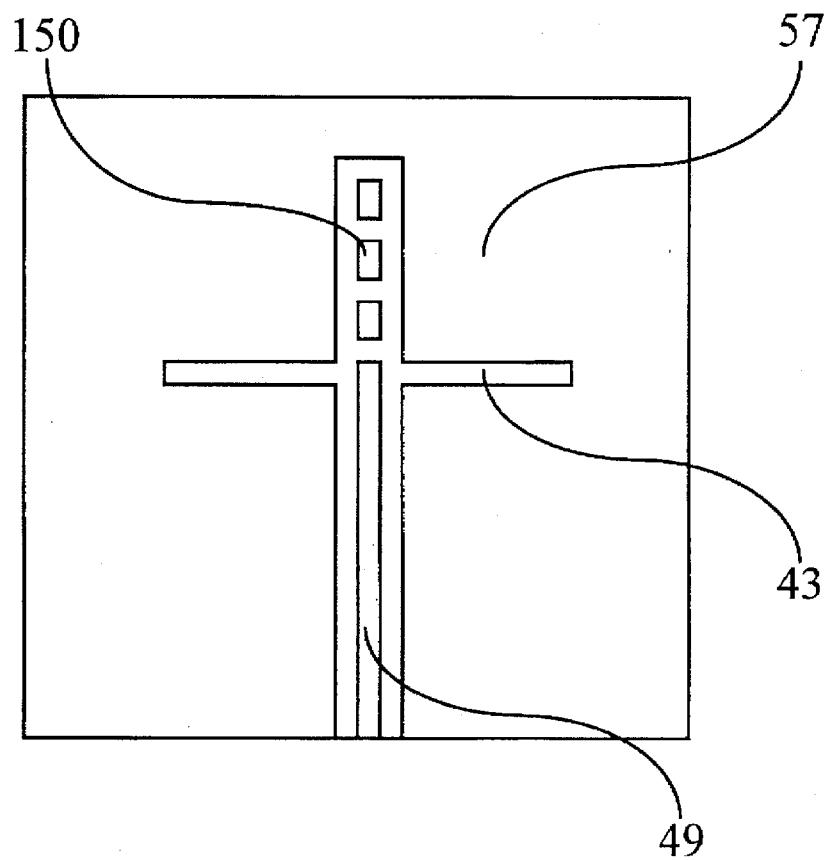
Figure 15D:
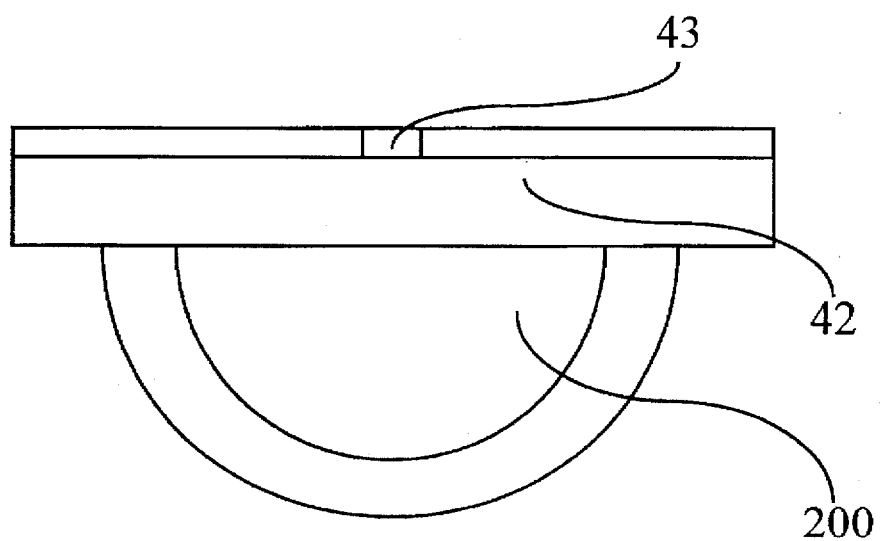

FIG. 15A shows a top view of an example of a coplanar feed aperture coupled patch antenna 43,44 in accordance with the second embodiment of the present invention. FIG. 15B shows a schematic cross-section parallel to the signal line 49 of the same structure. The balanced mode of the coplanar waveguide 49, 57 gives two magnetic currents in the opposite direction. Hence, the coplanar waveguide 49,57 does not radiate. The two magnetic currents split in the two so called slots and show a net magnetic current which will radiate. Most of the radiation goes into the high dielectric GaAs substrate 42 and will feed the metallic patch 44 at the opposite side of the substrate 42. When this patch 44 is in resonance it will effectively radiate broadside into free space. The antenna 43,44 gives an almost unidirectional radiation with low cross polarization levels due to the symmetric feed of the patch 44. The antenna 43,44 has a number of tuning parameters to match its impedance to the RTD 41: slot length s and width, patch size t, substrate thickness, so it is ideally suited for simultaneous use as an active antenna and as the resonator for the RTD 41. Optionally, the slot 43 may be capacitively coupled to the patch 44 as shown in FIG. 15C. In addition, open co-planar stubs 150 may be included adjacent the signal line in the slot 43 as shown in FIG. 14C for fine timing of the center oscillating frequency. The stubs may be connected by a gold wire to alter the stub length and, hence, the oscillating frequency of the RTD 41.

At very high frequencies these antennae may suffer from conductive and substrate mode loss. A solution to this problem, is to make the substrate thinner or to replace the patch by a substrate lens 200 shown in FIG. 15D. Assuming the slot 43 is the radiating source, the surface of the lens 200 may be hyperbolic as is generally known ("Electromagnetics", McGraw-Hill series in electrical engineering, John D. Kraus, page 691). The substrate lens 200 may be made from a material having a similar dielectric constant to that of the substrate 42 but need not be the same material. Thus, the material for the lens 200 may be cheaper than the substrate material, e.g. silicon instead of GaAs.

The manufacture of conductive and active layers 51-54 (from bottom to top of the active device) will be described with reference to FIGS. 16A to 16F. The conductive and active layers 52-54 of the active device may be grown by any conventional method (e.g. MBE) on top of an undoped GaAs substrate 42 or layer.

2a) A highly doped GaAs layer 52 which will form a back contact layer 52 of the active device is deposited on the undoped GaAs substrate 42. The active layers 53 are grown on top of the highly-doped back contact layer 52 to form an active device, e.g. a double barrier or single barrier Quantum Well Injection Transit Time diode (QWITT), IMPATT diode, or BARITT diode, a tunnel diode, or a High Electron Mobility Transistor (HEMT) etc.

Figure 16A:
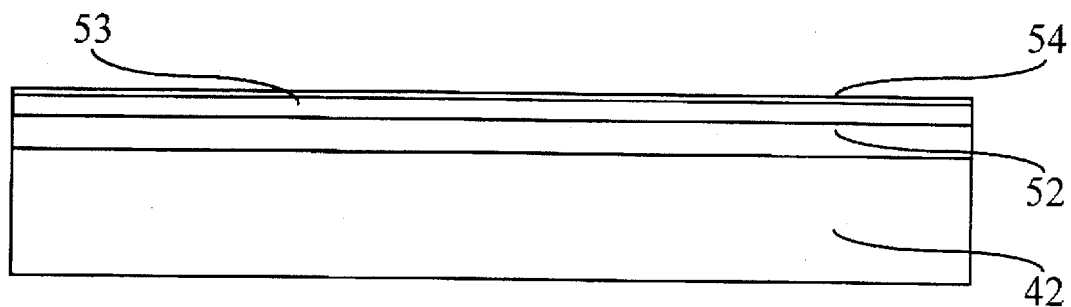
FIGS. 16A-16F show schematic cross-sections through the oscillator device in accordance with the second embodiment of the present invention for a series of manufacturing steps.

The active layers 53 may be freely chosen in accordance with the desired active device performance (e.g. using InGaAs layers). A highly-doped top contact layer 54 is deposited on top of the active layers 53 (FIG. 16A).

Figure 16B:
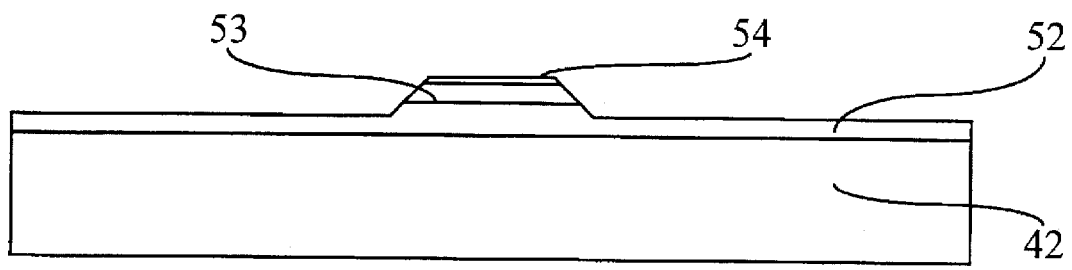
Figure 16C:
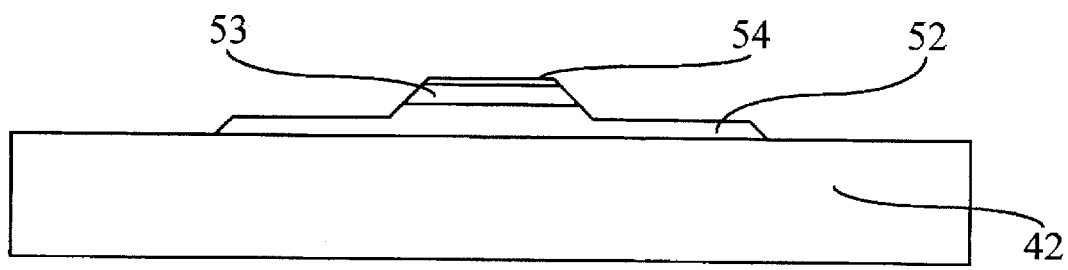

2b) A first mesa etch is performed into the back contact layer 52 (first mask, see FIG. 16B). This etch should be shallow to avoid thinning the back contact layer 52 and thus increasing the feed resistance 48 or the resistance of the connection to the bottom electrode of the capacitor 45. The size of the RTD 41 influences the RTD large signal conductance $G_{acd}$ and the RTD capacitance $C_d$.

2c) A second deeper mesa etch through the back contact layer 52 is performed to isolate the vertical active device, e.g. a vertical diode, preferably an RTD structure (second mask, see FIG. 16C) and to define the feed resistor 48 and the bottom electrode of the parallel plate decoupling capacitor 45.

Optionally, the device in accordance with the present invention may be constructed pseudo-monolithically (see FIG. 22) by selectively etching a sacrificial layer 51 and transferring the vertical diode to another substrate. Pseudo-monolithic manufacture will be described separately in more detail later.

Figure 16D:
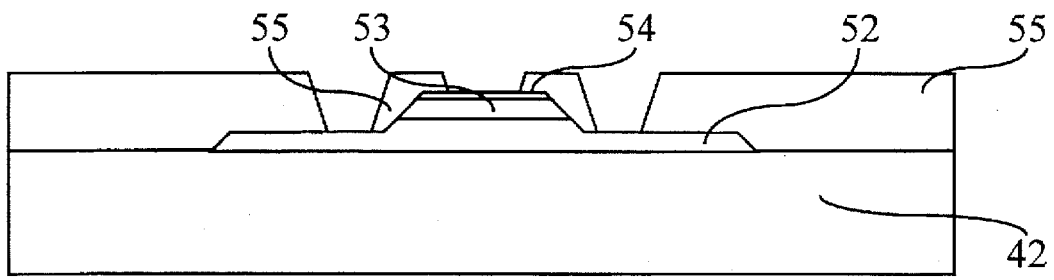

2d) A passivation layer 55, e.g. a polyimide or a nitride layer, is deposited over the complete structure and opened at the contact areas (third mask, see FIG. 16D). This layer 55 passivates the RTD 41 and the mesa resistance 48 and serves as dielectric for the decouple capacitor 45. Alternative materials for the passivation layer may be stress free polyimide, or benzocyclobutene BCB, polyphenylquinoxaline, polyimide iso-indoloquinazolinediones, fluorinated polyimide, silicone polyimide, acetylene terminated polyimide. Suitable materials have a dielectric constant of between 2 and 4, have low water uptake, low dielectric loss and may be planarized. Preferably they can be spun up to a thickness of 10 to 20 μm.

Figure 16E:
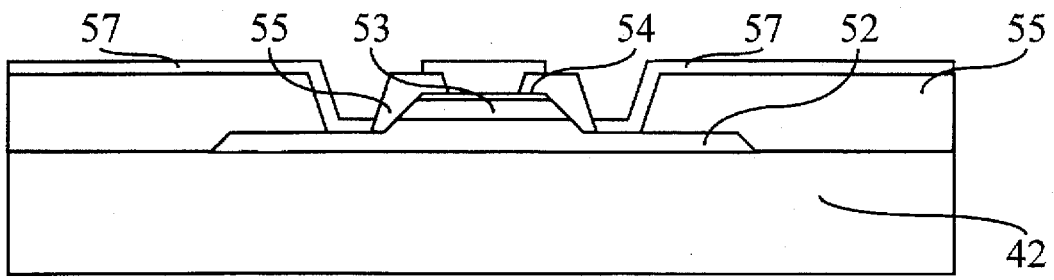

2e) The metallic contacts 56, 57 are deposited (FIG. 16E). After patterning (by etching or a lift-off process) the ohmic contacts 56, 57 of the device 41, the top electrode of the decouple capacitor 45, the feed inductance 47 and the slot antenna 43 are formed (fourth mask). The metallic contact 56 on top of the mesa also forms the signal conductor 49 of the coplanar waveguide 49,57 whereas the metallic contacts 57 on both sides of the active area serve as the ground plane for the coplanar waveguide 49,57. The decouple capacitor (45 in FIG. 10) is realized by using the highly doped bottom contact layer 52 (mask 2) as a bottom electrode, the passivation layer 55 (mask 3) as dielectric and the top metallisation (mask 4) as top electrode. The value of the capacitance can be adjusted by changing the dielectric constant of the passivation layer 55, by changing its thickness or by changing the overlap area of the top and bottom electrodes.

Figure 16F:
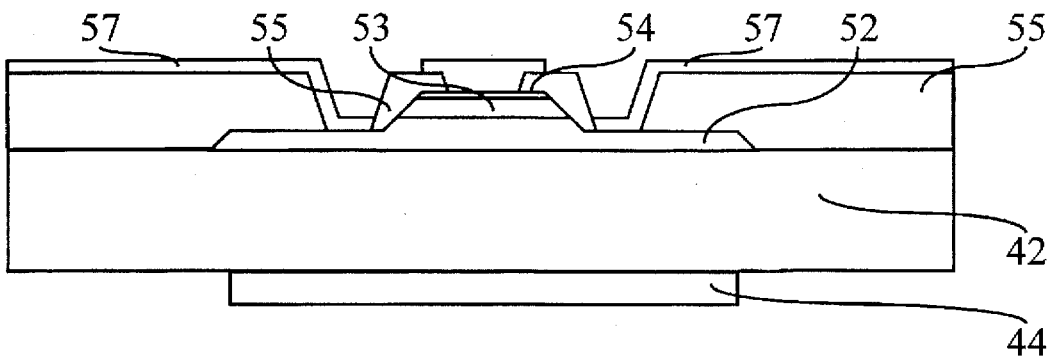

2f) The patch antenna 44 (fifth mask) is formed on the other side of the substrate 42, i.e. on the opposite side from the active device 41 by doing a final metallisation and patterning step (FIG. 16F).

An example for the second embodiment of the present invention uses a QWITT of 30 μm×30 μm and having a depletion length of 200 nm and the characteristics $C_d$=0.48 pF, $V_{d0}$=3.55 V, $I_{d0}$=13.5 mA, ΔV=0.5 V and ΔI=13.5 mA. The oscillation frequency is 13.7 GHz.

The maximum delivered output power $$P_{acd}^{max} = \frac{3}{16} \Delta V \Delta I = 1.265 \text{ mW}$$

A patch antenna is designed for a certain operation frequency. For optimum performance, the patch has a longitudinal dimension t equal to half of the effective wavelength $\lambda_{eff}$ of the operation frequency. The effective wavelength of the signal is proportional to the free space wavelength $\lambda_0$ divided by the square root of the substrate dielectric constant $\epsilon_r$. Hence, if a substrate with higher dielectric constant is used, the dimension of the patch decreases.

The efficiency of the radiation of a patch antenna strongly depends on the dielectric constant of the substrate. The ideal situation would be obtained with a patch surrounded by air ($\epsilon_r$=1). When the patch is put on a substrate material with a certain dielectric constant larger than the one of air, the electromagnetic field is pulled strongly into the substrate. This effect increases as the dielectric constant of the substrate increases. Consequently, the tangential component of the electrical fringing field and the radiation decreases with increasing dielectric constant.

In the choice of the substrate material there is a contradiction: a small antenna for a given frequency demands a substrate with high dielectric constant, while a good radiating antenna for the same frequency requires a substrate with low dielectric constant. The present invention provides a solution to this problem. A dielectric substrate with relative high dielectric constant is provided, which makes it possible to miniaturize the antenna, onto which a second layer with lower dielectric constant is spin coated, which enables good radiation. The negative influence of the high dielectric constant on the radiation efficiency is diminished by the addition of a layer of low dielectric material on the substrate, underneath the patch. In addition, by removing the spin coated top layer material that is not situated directly under the patch (e.g. by means of dry etching techniques), the patch is made co-extensive with the top layer. In this way the tangential component of the electromagnetic fringing field is mainly situated in air, providing a superior radiation efficiency in comparison to conventional designs.

The basis of the antenna in accordance with the third embodiment of the present invention is a substrate with a high dielectric constant. Undoped GaAs has a dielectric constant $\epsilon_r$≈10.9, and is a suitable material for the antenna. The substrate has preferably a dielectric constant $\epsilon_r$ of at least 4, e.g.. Cordierite, manufactured by Schot Glaswerke, Mainz, Gemany with $\epsilon_r$≈_4.85, or any other low loss high dielectric constant material. The optimum dielectric constant depends on the application and the operating frequency. If the frequency is low, device size may become a problem and a high dielectric constant is preferred, e.g. GaAs. At high frequencies the device dimension become too small and a low dielectric constant material is preferred, e.g. Coederite. Pseudo-monolithic manufacturing (described with reference to FIG. 22) is preferred and allows the growth of the active device on a semiconductive substrate followed by transfer to a substrate which may be selected having optimum electrical characteristics for the antenna in accordance with the present invention. The thickness $d_1$ of the high dielectric constant substrate is preferably in the range 100 µm to 1 mm, e.g. $d_1$ 32 500 µm. As described below, a multilayer wiring/insulation structure can be formed on this substrate material using thin film technology.

For a given operation frequency of the antenna the appropriate dimensions of the substrate and other layers may be selected as follows. From the dielectric constant $\epsilon_{r1}$ of the high dielectric substrate having a thickness $d_1$ and the dielectric constant $\epsilon_{r2}$ of the spin-coated low dielectric material having a thickness $d_2$, the total effective dielectric constant $\epsilon_{reff}$ of the structure can be determined.

Since $$\lambda_{eff} = \lambda_0 / \sqrt{\epsilon_{reff}}$$

the longitudinal dimension of the patch is determined by:

$$t = \frac{\lambda}{2} eff$$

The manufacture of the antenna may be done in thin film technology, which enables easy integration of the antennas into microsystems.

Multiple layers of low dielectric material are built up on the substrate, for example they may be spun onto the substrate. This low dielectric material may be, for example, photosensitive benzocyclobutene, photo-BCB (Cyclotene$^a$ supplied by the Dow Chemical Co., Midland, USA) with $\epsilon_r \approx 2.6$ or any other low dielectric loss material with a low dielectric constant such as standard or stress free polyimide, or benzocyclobutene BCB, polyphenylquinoxaline, polyimide iso-indoloquinazolinediones, fluorinated polyimide, silicone polyimide, acetylene terminated polyimide. Suitable materials have a dielectric constant of between 2 and 4, have low water uptake, low dielectric loss and may be planarized. The material is preferably spin-coatable. The thickness d2 of the photo-BCB layer may be in the range 1 to 50 µm, e.g. d2=20 µm.

Metal layers are deposited onto the substrate by conventional methods such as electrochemical deposition, sputtering or vaporization. Each metal layer is patterned by conventional methods. The metal layers may consist, for example of 2 µm thick Ti/Cu/Ti, patterned using wet etching.

The present invention may also provide a microwave or millimeter wave patch antenna comprising: a first substrate having a first dielectric constant, a second patterned substrate with a second dielectric constant different from said first dielectric constant and formed on said first substrate, a patch which is substantially coextensive with said second patterned substrate, and a feed line for operatively supplying a microwave or millimeter wave signal to, or receiving a microwave or millimeter wave signal from said patch. The antenna in accordance with the present invention may be a single frequency resonant antenna. By provision of further intermediate conductive layers between the feed line and the patch, the band width of the antenna can be increased. Further, the feed line may include a slot.

Figure 17A:
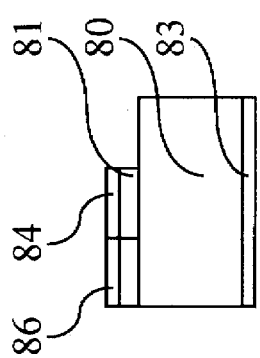
Figure 17B:
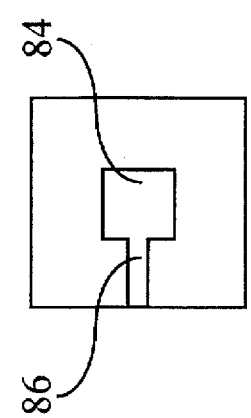

A first construction of an antenna according to the third embodiment of the present invention is shown schematically in FIGS. 17A and 17B. On the bottom of a substrate 80 with high dielectric constant a full metal reference plane 83 is formed and on top of the substrate a low dielectric constant layer 81 is spin coated. The patch 84 and the feed line 86 are formed co-extensively with the low dielectric constant layer 81. The low dielectric constant material 81 that is not under the patch 84 or the feed line 86 is removed by dry etching.

For example, the reference plane is deposited on the bottom of a high dielectric constant substrate by sputtering or electrolytic plating a Ti(300 Å)/Cu(2 µm)/Ti(300 Å) conductive layer. Then the low dielectric constant material is spun on top of the substrate (20 µm thick, baking at 80Ê¼C hot plate, photosensitive exposure, development and baking at 230Ê¼C). The low dielectric constant material is patterned by dry etching. Finally, the metal antenna patch and feed line is sputtered onto the remaining low dielectric constant layer as a Ti(300 Å)/Cu(2 µm)/Ti(300 Å) conductive layer.

Figure 18C:
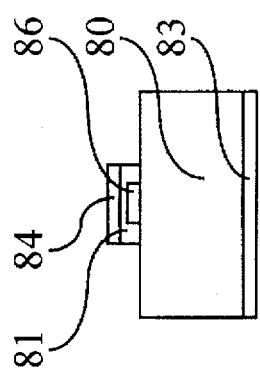
Figure 18A:
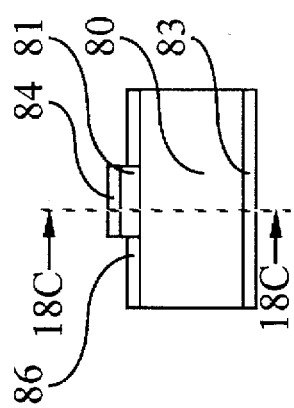
Figure 18B:
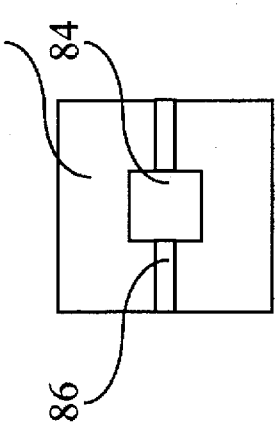

A further antenna in accordance with the third embodiment is shown in FIGS. 18A to 18C and also includes a substrate 80 with high dielectric constant. The feed line 86 for the patch 84 is formed on the top of the high dielectric constant substrate 80. A full metal reference plane 83 is deposited on the bottom of the substrate 80 and the low dielectric constant layer 81 is a spin coated onto the top of the substrate 80 and over the feed line 86. The patch 84 is formed co-extensively with the low dielectric constant layer 81. In this way the patch 84 is fed by electromagnetic coupling through the low dielectric material. The low dielectric material that is not directly under de patch 84 is removed by dry etching.

For example, both sides of the high dielectric constant substrate are metallised by sputtering or electrolytic plating a Ti(300 Å)/Cu(2 µm)/Ti(300 Å) conductive layer. The bottom metallisation becomes the large reference metallisation, while the top is patterned to form the feed line. Next, a 20 µm thick low dielectric constant layer is spun coated onto the feed line and the substrate. Then the metal antenna patch is sputtered onto the low dielectric constant layer as a Ti(300 Å)/Cu(2 µm)/Ti(300 Å) conductive layer. Finally, the low dielectric constant material that is not directly under the antenna patch is removed using dry etching.

A further antenna in accordance with the third embodiment includes a substrate 80 with high dielectric constant with a layer 81, 85 of spin coated low dielectric constant material on both sides is shown in FIGS. 19A to 19C. The feed line 86 is on the bottom low dielectric constant layer 85. The signal couples electromagnetically with the patch 84 on top of the top low dielectric constant layer 81 through a slot in the metal reference plane 83 between the upper low dielectric constant layer 81 and the high dielectric constant substrate 80. The upper low dielectric constant material that is not directly under the patch is removed by dry etching.

For example, on the bottom of the high dielectric constant substrate a 20 µm thick low dielectric constant layer is spun on. Then, on the bottom of this low dielectric constant layer, the feed line is sputtered or electrolytically plated with Ti(300 Å)/Cu(2 µm)/Ti(300 Å) metal and patterned. Next, a Ti(300 Å)/Cu(2 µm)/Ti(300 Å) conductive reference layer with an optimal dimensioned slot is sputtered on top of the high dielectric constant substrate. Following, a second 20 µm thick low dielectric material is spun onto the slotted reference layer. Then the metal antenna patch is sputtered onto the low dielectric constant layer as a Ti(300 Å)/Cu(2 µm)/Ti(300 Å) conductive layer. Finally, the low dielectric constant material that is not directly under the upper antenna patch is removed using dry etching leaving the patch co-extensive with the underlying insulation.

Still a further antenna in accordance with the third embodiment includes a substrate 80 with high dielectric constant with layers 81 and 85 of low dielectric constant material spin coated on both sides as shown in FIGS. 20A to 20C. The feed line 86 is formed on the bottom of the bottom low dielectric constant layer 85. The signal couples electromagnetically with the patch 84 on top of the upper low dielectric constant layer 81 through a slot in the metal reference plane 83 located between the bottom low dielectric constant layer 85 and the high dielectric constant substrate 80. The upper low dielectric material that is not directly under the patch is removed by dry etching.

For example, on the bottom of the high dielectric constant substrate a Ti(300 Å)/Cu(2 μm)/Ti(300 Å) conductive reference layer with an optimal dimensioned slot is sputtered or electrolytic plated. Next, a 20 μm thick low dielectric constant material is spun on the reference layer. On the bottom of this low dielectric constant layer, the feed line is formed by sputtering Ti(300 Å)/Cu(2 μm)/Ti(300 Å) metal and patterned. Then, on top of the high dielectric constant substrate, a second 20 μm thick low dielectric constant layer is spun on. Then, the metal antenna patch is sputtered onto the second low dielectric constant layer as a Ti(300 Å)/Cu(2 μm)/Ti(300 Å) conductive layer. Finally, the low dielectric constant material that is not directly under the antenna patch is removed using dry etching leaving the patch co-extensive with the underlying insulation.

The antennae described with reference to FIGS. 19 and 20 as the patch 84 is placed on the opposite surface of the substrate 80 from the signal line 86. This reduces electromagnetic interference between the patch 84 and the active device.

The antennae of the third embodiment of the present invention may be used with the oscillator devices of the first and second embodiments. In particular the signal line 49 of the co-planar transmission line 49, 57 may be the feed line 86 of any of the antenna designs. The patch 44 may be the patch 84. When used in the oscillator device of the second embodiment the patch antenna 84 is preferably arranged on the major surface on the opposite side of the substrate 42 from the active device 41 to reduce electromagnetic interference between the electromagnetic radiation from the antenna and the active device, microstrip and co-planar lines. In both the first and second embodiments, the high dielectric constant layer 80 of the antenna according to the third embodiment may be provided by the undoped GaAs substrate 2, 42. Alternatively, in accordance with a fourth embodiment of the present invention a different substrate from the semiconductor substrate 2,42 may be used (see below). In particular, the high dielectric constant substrate 80 of the third embodiment may be the substrate 90 of the fourth embodiment.

Figure 21:
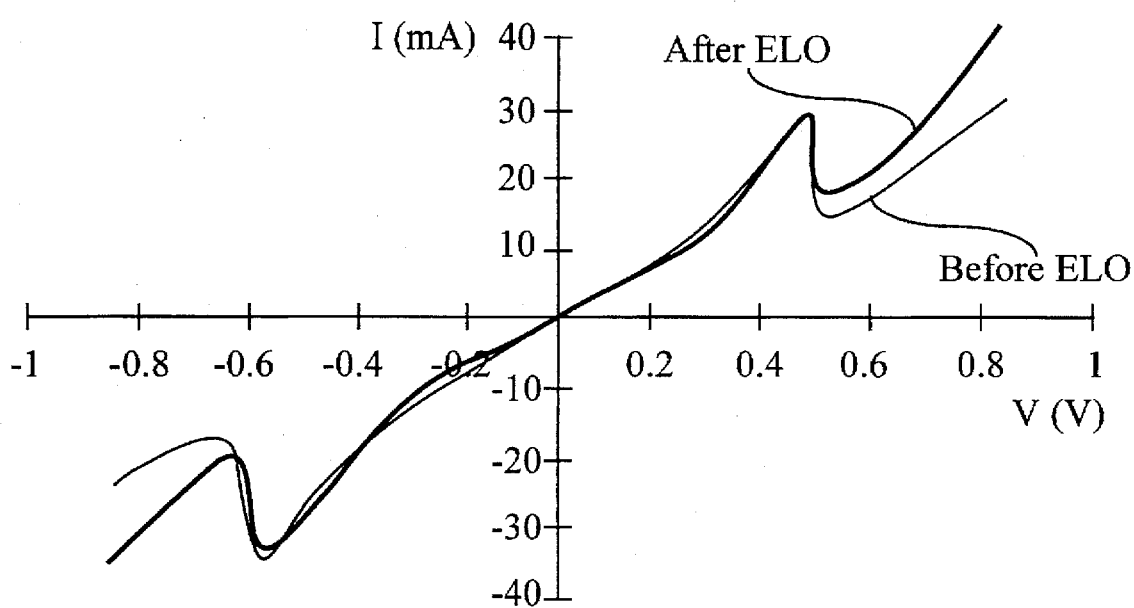
FIG. 21 shows electrical characteristics of the oscillator device in accordance with a fourth embodiment of the present invention.
Figure 22A:
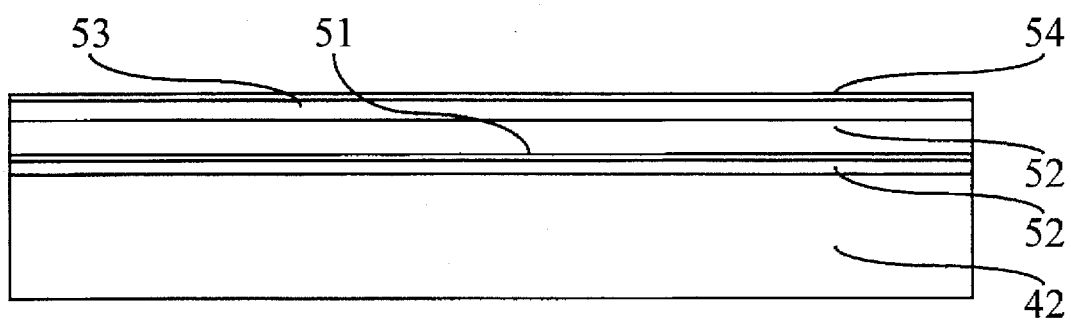
FIG. 22A to 22I show schematic cross-sections through the oscillator device in accordance with the fourth embodiment of the present invention for a series of manufacturing steps.
Figure 22B:
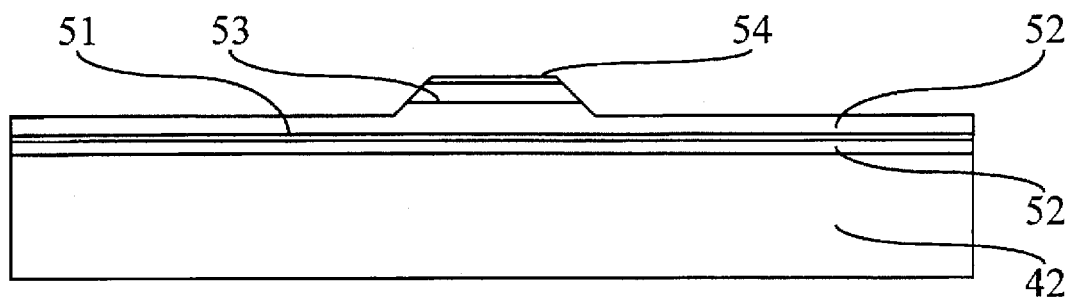
Figure 22C:
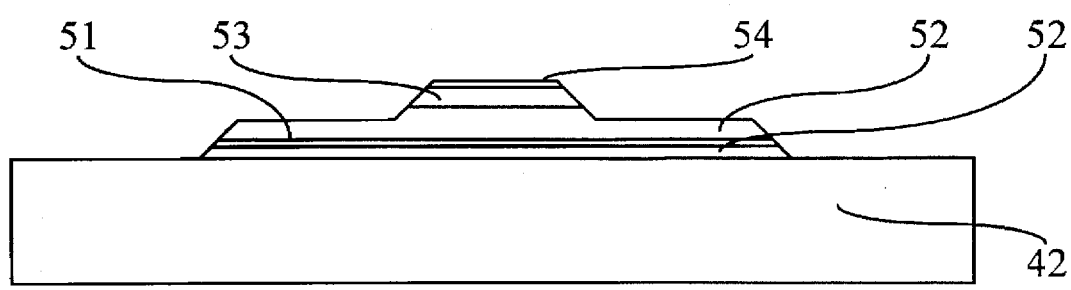
Figure 22D:
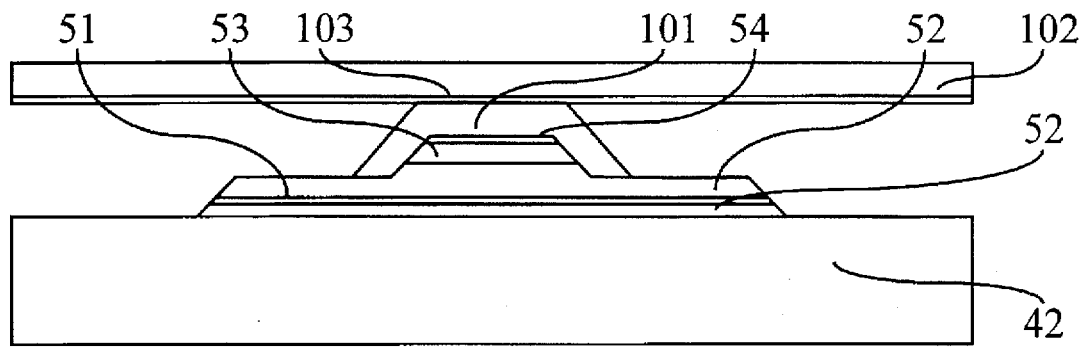
Figure 22E:
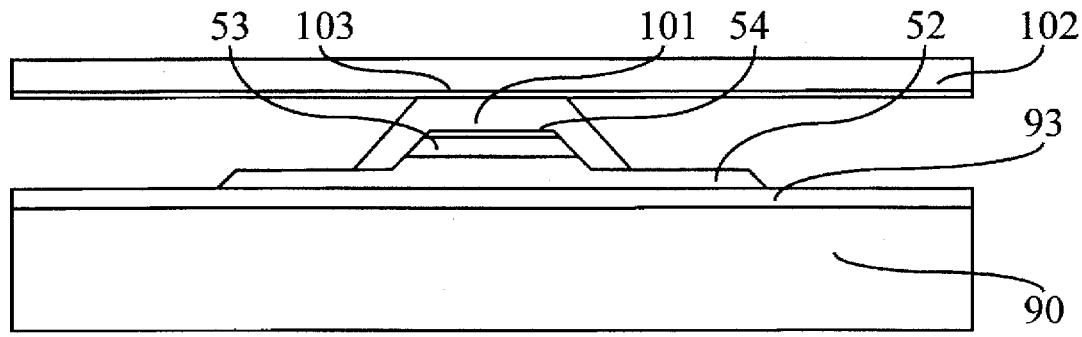

With reference to FIGS. 22A to I, the device according to the fourth embodiment of present invention may be constructed pseudo-monolithically, e.g. layers 52–54 may be removed and placed on another substrate 90 by any conventional method as shown schematically in FIGS. 22D and E, e.g. by epitaxial lift-off ELO, or CLEFT. The active device 41 according to the present invention is preferably grown on a semiconductor substrate 42 in accordance with steps 2a to 2c (second embodiment, FIG. 16A to C, mentioned above) including a thin AlAs layer 51 and then transferred to a more suitable lower dielectric loss substrate 90 by means of ELO. Surprisingly, the non-linear current-voltage characteristic of such an active device, e.g. an RTD consisting of several very thin and critical layers, is hardly changed by the transfer process. In FIG. 21 the dot-dash line shows the voltage-current characteristic of an RTD before ELO and the solid line shows the characteristic after ELO. After ELO the peak to valley currents and voltage differences are slightly greater (providing a higher theoretical power output) and the series resistance is slightly higher. All values lie within the manufacturing tolerances for such devices.

ELO also allows unwanted active devices to be removed and discarded and the expensive semiconductor substrate may be re-used after a cleaning etch. The host substrate may be considerably cheaper and/or have advantageous properties such as an optimum dielectric constant and low dielectric loss. An optional thin (e.g. 50 nm) AlAs layer 51 provides the possibility of releasing all the subsequently applied higher layers 52 to 54 from the undoped GaAs substrate 42 and applying them to another substrate.

The manufacturing steps of the fourth embodiment are as follows:

3a) A highly doped GaAs layer 52 which will form a back contact layer 52 of the active device is deposited on the substrate 42 and the conditions altered to form an intermediate thin AlAs layer 51. The active layers 53 are grown on top of the highly-doped back contact layer 52 to form an active device. A highly-doped top contact layer 54 is deposited on top of the active layers 53 (FIG. 22A).

3b) The mesa etches (first and second masks) are performed as for the second embodiment (FIGS. 22B and 22C).

3c) A support layer 101 is deposited over the active layers 53: this layer protects the very thin active layers 53 during etching of the sacrificial AlAs layer 51 and supports these layers during transplantation to the new substrate 90 (FIG. 22D). The support layer may be black wax, e.g. Apiezon W, or photosensitive benzocyclobutene (photo-BCB, Cyclotene$^a$ supplied by the Dow Chemical Co., Midland, USA), or similar. Preferably, the AlAs layer 51 is selectively etched in a 1:10 HF:H$_2$O solution. The extreme etch selectivity of AlAs with respect to GaAs in the HF:H$_2$O (1:10) solution ($>10^7$) allows selective etching of the sacrificial AlAs layer 51 between the undoped GaAs substrate 42 and the device layers 52–54 resulting in their release. By attaching the support layer to a manipulator 102,103, these thin layers 52–54 can be transplanted and bonded by Van der Waals forces or by eutectic metals to any other desired substrate, e.g. an electromagnetically more favorable substrate 90 (lower dielectric constant, a lens shaped substrate, an MCM thin film substrate etc.). The support layer 101 may then be removed by conventional means. It is particularly preferred if the manipulator 102, 103 is a UV tape with an adhesive layer 103 which loses its adhesion under intense UV light and a clear backing 102. The protective layer 101 is preferably photo-sensitive BCB.

Figure 22F:
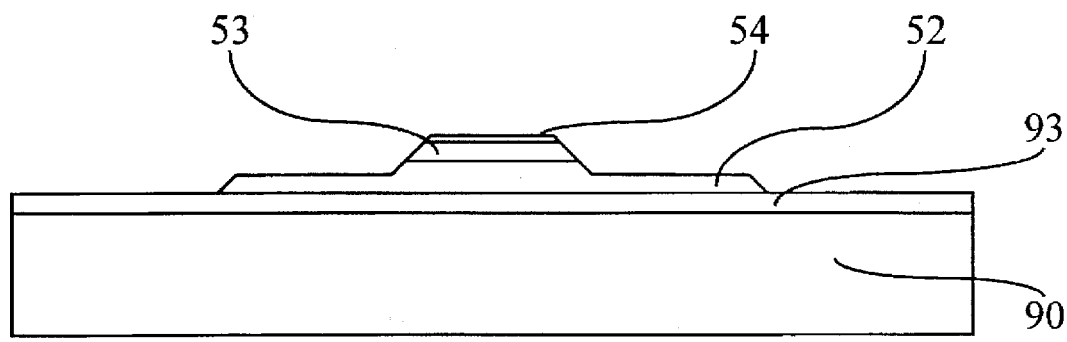

After patterning of the mesa (first and second masks, FIG. 22B and 22C), the BCB protective layer 101 is applied and patterned as shown in FIG. 22D using the second mask. The UV tape is adhered to the BCB layer 101. A second substrate 90 is prepared with a planar conductive coating 93. The conductive coating 93 may be a metallisation layer such as gold or passivated copper. The conductive layer 93 is patterned by etching or lift-off to form the bottom contact region of the active device, the bottom electrode of the decouple capacitor 45 and optionally the slot antenna (the second mask may be re-used for this pattern). The sacrificial layer 51 is selectively etched in a solution of HF:H$_2$O in the relationship 1:10 and the device(s) is (are) transferred to the bottom contact region 93 using the tape 102, 103 (FIG. 24E). The vertical diode 41 is attached to the conductive layer 93 of the new substrate 90 by a eutectic metal or by Van der Waals forces. The UV tape 102, 103 is then removed by denaturing the adhesive layer 103 in strong UV light and then the BCB protective layer 101 is removed (FIG. 22F).

Figure 22G:
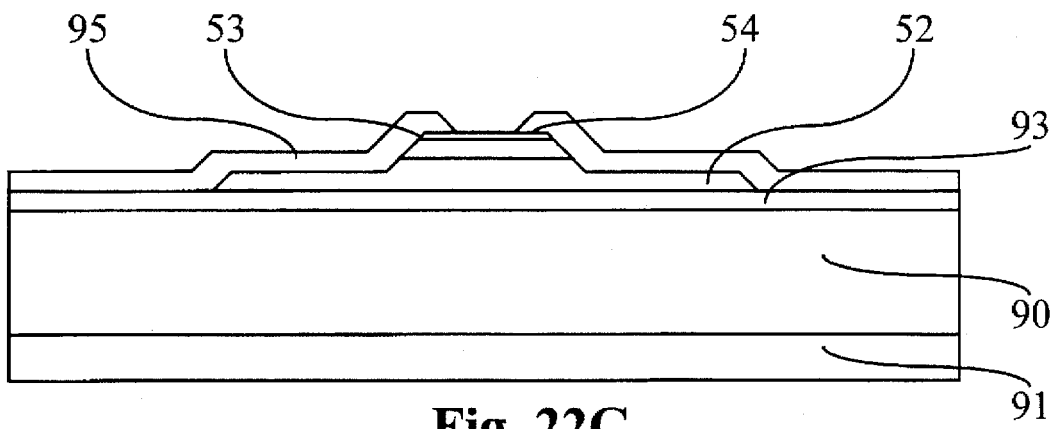

3d) Passivation layers 95 and 91 are applied on both the top and bottom of the substrate 90, respectively, e.g. nitride or low dielectric constant polyimide or BCB, and patterned (third mask) to open contact areas on the active device 41 (FIG. 22G).

Figure 22H:
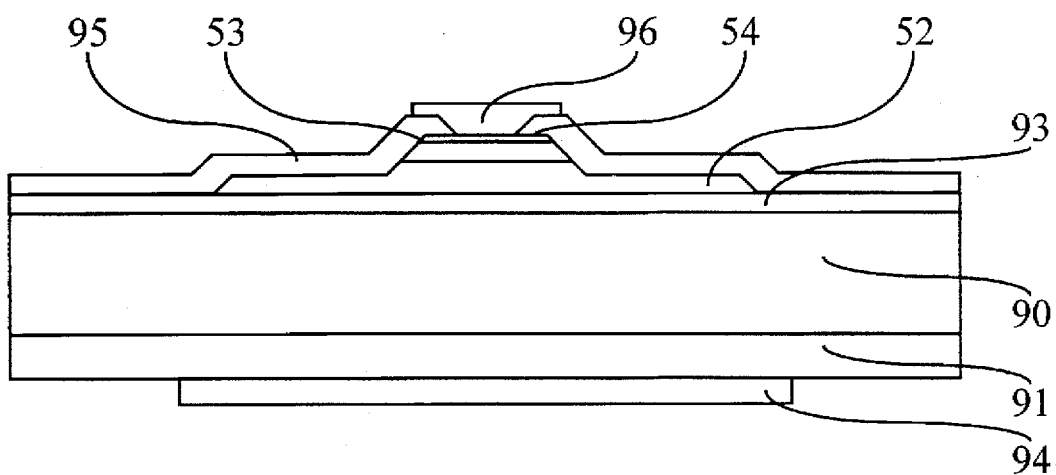

3e) A second metallisation is applied and patterned (fourth mask) forming metallic contacts 96 of the device 41, the top electrode of the decouple capacitor 45, the feed inductance 47, the patch 94 and optionally the slot antenna 43 if this is not formed with the first conductive layer 93 (FIG. 22H). The metallic contact 96 on top of the mesa forms the signal conductor of the coplanar waveguide 49. The decouple capacitor (45 in FIG. 10) is realized by using the conductive layer 93 as a bottom electrode, the passivation layer 95 (mask 3) as dielectric and the top metallisation 96 (mask 4) as top electrode.

Figure 22I:
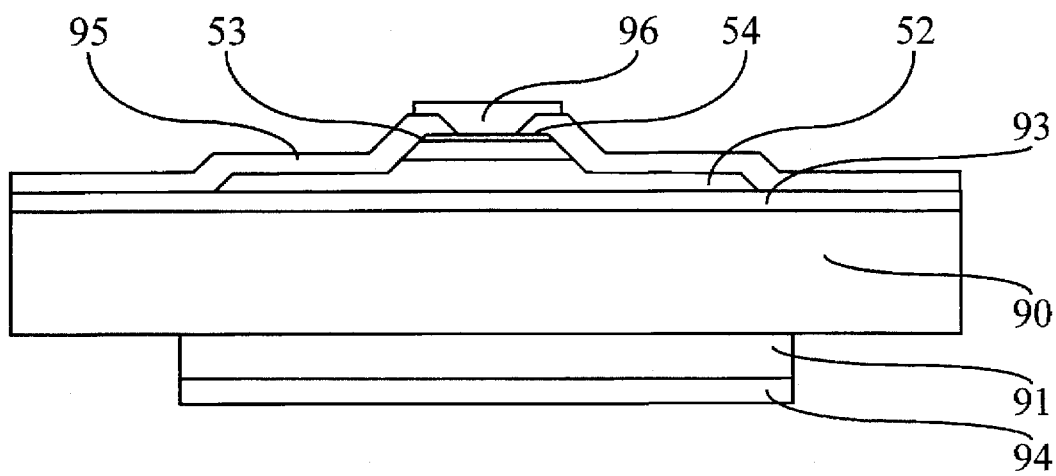

3f) Finally the insulating layer 91 is etched to form the patch antenna 94 co-extensively with the insulating layer 91 (FIG. 22I).

Hence, the present invention may provide a method of fabrication of a microwave or millimeter wave oscillator device for a transmitter or receiver, comprising the steps of: depositing a sacrificial layer onto a first semiconductor substrate, depositing active layers onto said sacrificial layer, etching said layered first semiconductor substrate to form a vertical active device as a mesa, separating said vertical active device from said first semi-conductor substrate by selectively etching said sacrificial layer, and bonding said vertical active device to a second substrate. Preferably said second substrate includes a patterned first conductive layer to which the active device is transferred. Preferably the active device is an RTD.

As explained below, further steps according to the present invention may be: forming passive components on said second substrate by: depositing an insulating layer on said second substrate, patterning said insulating layer, depositing a second conductive layer on said second substrate, and patterning said second conductive layer, said second conductive layer being in contact with said active device. The patterning of the first and second conductor layers may form part of a stacked interconnection system of wiring layers wherein the wiring lines in one layer all run in the same direction and perpendicular to the directions of wiring lines in the layers above and beneath. Each wiring layer is insulated from the layers above and below by an insulating layer.

In accordance with a fifth embodiment of the present invention, the first to fourth embodiments of the present invention are preferably completed using multichip module thin film technology (MCM-D). Preferably, the metal deposition and patterning steps 2d to 2f of the second embodiment or 3d to 3f of the fourth embodiment are used not only to define the passive components of the circuit but also to form part of a multilayered interconnection structure of the kind known generally from MCM-D. The advantage of forming these layers at the same time as the electrodes and signal lines of the passive components is that the interconnections for more than one active device or more than one antenna as well as the interconnections of other components of a larger electronic device may be carried out simultaneously. This saves time and reduces manufacturing costs. In particular several antennae and oscillators in accordance with the present invention may be joined together by joining the antennae with transmission lines of one wavelength with a resistance across each transmission line at the half-way point.

In accordance with the fifth embodiment of the invention, the internal conductive lines may preferably be made from Ti/Cu/Ti whereas the outer lines may be made from Ti/Au. The width of the lines may be in the range of 20–50 μm and their thickness may be a few μm. The insulation layers are unsupported polymeric layers, typically standard or stress free polyimide, or benzocyclobutene BCB, polyphenylquinoxaline, polyimide iso-indoloquinazolinediones, fluorinated polyimide, silicone polyimide, acetylene terminated polyimide. BCB is preferred as it may be planarized well. In the first to fourth embodiments, the active device, e.g. the RTD 41, may be formed on a first semiconductor substrate, tested if necessary, removed from the first substrate, transferred to the MCM thin film substrate 90 (FIG. 22E) by means of ELO and finally bonded thereto. The passive components such as waveguides, transmission lines, resistors and capacitors and the reference plane, the low dielectric constant layer and the co-planar feed of the patch antennas can be formed subsequently from only two patterned metal layers and layers of insulation.

The oscillator device according to the present invention may find application in radar transmitters and receivers. In particular, the oscillator according to the present invention may be used in automobile radar distance and speed sensing devices whereby the active device may be used as a mixer as well as an oscillator.

We claim:

1. A millimeter or microwave oscillator device for a receiver or a transmitter comprising:

a high frequency oscillating circuit including an active device, said active device having a first and a second contact, a signal line of said oscillator device being connected to said first contact for connection to a load circuit, a biasing circuit for said active device, and a low frequency oscillation suppression circuit, wherein said low frequency oscillation suppression circuit includes a decoupling capacitor and one electrode of said decoupling capacitor is connected to said second contact.

2. An oscillator device according to claim 1 further comprising:

a substrate, said active device being on said substrate, a load circuit functioning in use simultaneously as a resonator and as an antenna, said load circuit including a first radiating antenna element and a second antenna element on said substrate, said second antenna element being connected to said active device and being electromagnetically coupled with said first radiating antenna element for supplying a microwave or millimeter wave signal to, or receiving a microwave or millimeter wave signal from said first radiating antenna element.

3. An oscillator device according to claim 2, wherein said substrate has first and second major surfaces, said active device is on said first major surface of said substrate and said first radiating antenna element is on said second major surface of said substrate.

4. An oscillator device according to claim 3, wherein said oscillator device oscillates at a center frequency, and said oscillator device further comprises a passive component tuning circuit for fine tuning the operating frequency of the oscillator about the center frequency.

5. An oscillator device in accordance with claim 3, wherein said substrate has a first layer with a first dielectric constant and a second layer with a second dielectric constant different from said first dielectric constant and formed on said first layer, and said first radiating antenna element is a patch antenna formed on said second layer.

6. An oscillator device in accordance with claim 5, wherein said signal line is a coplanar feed line, said second layer is patterned, said patch antenna is co-extensive with said patterned second layer, said first dielectric constant is higher than said second dielectric constant and said second antenna element is a slot antenna.

7. An oscillator according to claim 5, wherein said active device has a voltage - current characteristic with a negative resistance region.

8. An oscillator according to claim 5, wherein said active device is a resonant tunnel diode.

9. A method for designing a microwave or millimeter wave oscillator device according to claim 2, comprising the steps of:

measuring the direct current - voltage characteristic of an active device with a negative differential resistance region, determining the operating frequency for the oscillator circuit, determining the characteristic impedance and the optimum oscillation conductance, and optimizing the load of the oscillator circuit to obtain the optimum power output.

10. A method according to claim 9 wherein the characteristic impedance and the optimum oscillation conductance are determined by means of a numerical - graphical method.

11. A method of fabrication of a microwave or millimeter wave oscillator device for a transmitter or receiver, comprising the steps of:

depositing a first conductive layer onto a first substrate, forming a vertical active device as a mesa on said first substrate, and forming a back contact region and a capacitor electrode region in said first conductive layer.

12. A method according to claim 11, wherein said step of forming a vertical active device includes a transfer step including the steps:

depositing a sacrificial layer onto a second semiconductor substrate, depositing active layers onto said sacrificial layer, etching said layered second semiconductor substrate to form said vertical active device as a mesa, separating said vertical active device from said second semi-conductor substrate by selectively etching said sacrificial layer, and bonding said vertical active device to said first substrate.

13. A method according to claim 12, wherein passive components including a decoupling capacitor are formed on said first substrate by the steps of:

patterning said first conductive layer to form at least said capacitor electrode region, depositing an insulating layer on said first substrate after said vertical active device forming step, patterning said insulating layer, depositing a second conductive layer on said first substrate, and patterning said second conductive layer, at least a part of said second conductive layer being in contact with said vertical active device.

14. A method according to claim 13, wherein the vertical active device is deposited on a first major surface of said first substrate, and an antenna patch is formed on a second major surface of said substrate.

* * * * *